(12) United States Patent
Shu et al.

(10) Patent No.: US 11,581,374 B2
(45) Date of Patent: Feb. 14, 2023

(54) DISPLAY SUBSTRATE AND METHOD OF MANUFACTURING THE SAME, DISPLAY DEVICE

(71) Applicant: BOE TECHNOLOGY GROUP CO., LTD., Beijing (CN)

(72) Inventors: Shi Shu, Beijing (CN); Chuanxiang Xu, Beijing (CN); Qi Yao, Beijing (CN); Haitao Huang, Beijing (CN); Xue Jiang, Beijing (CN)

(73) Assignee: BOE TECHNOLOGY GROUP CO. LTD., Bejing (CN)

( * ) Notice: Subject to any disclaimer, the term of this patent is extended or adjusted under 35 U.S.C. 154(b) by 84 days.

(21) Appl. No.: 16/768,647

(22) PCT Filed: Aug. 6, 2019

(86) PCT No.: PCT/CN2019/099522
§ 371 (c)(1),
(2) Date: May 29, 2020

(87) PCT Pub. No.: WO2021/022495
PCT Pub. Date: Feb. 11, 2021

(65) Prior Publication Data
US 2022/0005891 A1  Jan. 6, 2022

(51) Int. Cl.
*H01L 27/32* (2006.01)
*H01L 51/56* (2006.01)
*G06K 9/00* (2022.01)
*G06F 3/041* (2006.01)
(Continued)

(52) U.S. Cl.
CPC ........ *H01L 27/3234* (2013.01); *G06F 3/0412* (2013.01); *G06F 3/0443* (2019.05); *G06V 40/1318* (2022.01); *H01L 27/322* (2013.01); *H01L 27/323* (2013.01); *H01L 27/3272* (2013.01); *H01L 51/56* (2013.01); *G06F 3/0446* (2019.05); *G06F 2203/04103* (2013.01); *G06F 2203/04111* (2013.01); *H01L 2227/323* (2013.01)

(58) Field of Classification Search
CPC .............. H01L 27/323; H01L 27/3227; H01L 27/3234; G06F 3/0412; G06V 40/1318
See application file for complete search history.

(56) References Cited

U.S. PATENT DOCUMENTS 10,541,280 B1 * 1/2020 Krah ..................... G06F 3/0446
11,342,392 B2 * 5/2022 Tang ..................... G06F 3/0421
2012/0113058 A1  5/2012 Yamazaki et al.
(Continued)

FOREIGN PATENT DOCUMENTS

CN  106157891 A  11/2016
CN  107133613 A  9/2017
CN  107632738 A  1/2018

*Primary Examiner* — Victoria K. Hall
(74) *Attorney, Agent, or Firm* — Procopio, Cory, Hargreaves & Savitch LLP

(57) ABSTRACT

A display substrate includes a base, a plurality of light-emitting devices disposed on the base, an encapsulation layer disposed on a light-emitting side of the plurality of light-emitting devices away from the base, and at least one photosensitive sensor disposed on a surface of the encapsulation layer away from the base. Each of the at least one photosensitive sensor is configured to collect optical signals for texture recognition.

14 Claims, 13 Drawing Sheets

(51) Int. Cl.
*G06F 3/044* (2006.01)
*G06V 40/13* (2022.01)

(56) References Cited

U.S. PATENT DOCUMENTS

| | | | | |
|---|---|---|---|---|
| 2014/0299879 | A1* | 10/2014 | Yamazaki | G06F 1/1643 |
| | | | | 257/53 |
| 2016/0260924 | A1* | 9/2016 | Lee | H01L 51/56 |
| 2018/0005007 | A1* | 1/2018 | Du | G09G 3/3225 |
| 2018/0069068 | A1* | 3/2018 | Ka | H01L 51/50 |
| 2018/0074614 | A1* | 3/2018 | Hiraga. | G06F 3/0445 |
| 2018/0175178 | A1* | 6/2018 | Jo | H01L 29/41733 |
| 2018/0239942 | A1* | 8/2018 | Xu | H01L 27/323 |
| 2018/0357464 | A1 | 12/2018 | Wang et al. | |
| 2019/0087044 | A1* | 3/2019 | Cho | G06F 3/0412 |
| 2019/0102018 | A1 | 4/2019 | Qin et al. | |
| 2019/0237521 | A1* | 8/2019 | Ju | H01L 27/323 |
| 2019/0237522 | A1* | 8/2019 | Gao | H01L 51/5256 |
| 2019/0251378 | A1* | 8/2019 | Jung | G06V 40/1306 |
| 2019/0294851 | A1* | 9/2019 | Chung | H01L 27/3234 |
| 2019/0319075 | A1* | 10/2019 | Lee | G06F 3/0446 |
| 2020/0004381 | A1* | 1/2020 | Han | H01L 27/3272 |
| 2020/0133414 | A1* | 4/2020 | Lee | G06F 3/04164 |
| 2020/0194516 | A1* | 6/2020 | Kim | H04M 1/0266 |
| 2020/0219455 | A1* | 7/2020 | Lius | H01L 27/3234 |
| 2020/0411608 | A1* | 12/2020 | Tang | H01L 27/3227 |
| 2021/0151524 | A1* | 5/2021 | Tang | H01L 27/3234 |
| 2021/0233962 | A1* | 7/2021 | Wang | G06F 3/0446 |
| 2021/0233975 | A1* | 7/2021 | Bouthinon | H01L 27/322 |
| 2022/0005891 | A1* | 1/2022 | Shu | H01L 27/322 |

\* cited by examiner

DISPLAY SUBSTRATE AND METHOD OF MANUFACTURING THE SAME, DISPLAY DEVICE

TECHNICAL FIELD

The present disclosure relates to the field of display technologies, and more particularly, to a display substrate and a method of manufacturing the same, and a display device.

BACKGROUND

At present, fingerprint recognition technologies include capacitive fingerprint recognition, ultrasonic fingerprint recognition and optical fingerprint recognition. Among them, optical fingerprint recognition, as a mainstream under-screen fingerprint recognition technology, has a relatively wide range of applications.

SUMMARY

In one aspect, a display substrate is provided. The display substrate includes a base, a plurality of light-emitting devices disposed on the base, an encapsulation layer disposed on a light-emitting side of the plurality of light-emitting devices away from the base; and at least one photosensitive sensor disposed on a surface of the encapsulation layer away from the base. Each of the at least one photosensitive sensor is configured to collect optical signals for texture recognition.

In some embodiments, the display substrate further includes at least one touch structure disposed at a side of the encapsulation layer away from the base. An orthographic projection of any one of the at least one touch structure on the base is nonoverlapping with an orthographic projection of each photosensitive sensor on the base.

In some embodiments, the photosensitive sensor includes: a control electrode, a first insulating layer, and a photosensitive semiconductor layer that are sequentially stacked on top of one another in a direction away from the base; and a first electrode and a second electrode electrically connected to the photosensitive semiconductor layer.

In some embodiments, in a case where the display substrate includes the at least one touch structure, each of the at least one touch structure includes a third electrode and a fourth electrode that are insulated from each other. The third electrode includes two third sub-electrodes arranged in a same layer as the fourth electrode, and a bridging sub-electrode electrically connected to the two third sub-electrodes. The bridging sub-electrode and the fourth electrode are arranged in different layers and are insulated from each other. The first electrode and the second electrode in the photosensitive sensor are arranged in a same layer as the bridging sub-electrode and are insulated from the bridging sub-electrode.

In some embodiments, in a case where the display substrate includes the at least one touch structure, each of the at least one touch structure includes a third electrode and a fourth electrode that are insulated from each other. The third electrode includes two third sub-electrodes arranged in a same layer as the fourth electrode, and a bridging sub-electrode electrically connected to the two third sub-electrodes. The bridging sub-electrode and the fourth electrode are arranged in different layers and are insulated from each other. The control electrode in the photosensitive sensor and the bridging sub-electrode are arranged in a same layer and are insulated from each other, and the first electrode and the second electrode in the photosensitive sensor are arranged in a same layer as the fourth electrode and are insulated from the fourth electrode.

In some embodiments, the first electrode in the at least one photosensitive sensor is electrically connected to a scanning signal line. The second electrode in the at least one photosensitive sensor is electrically connected to a common electrode line.

In some embodiments, the display substrate further includes at least one light-shielding portion disposed at a side of the at least one photosensitive sensor away from the base. The orthographic projection of each photosensitive sensor on the base is nonoverlapping with or partially overlaps with an orthographic projection of any one of the at least one light-shielding portion on the base.

In some embodiments, in a case where the photosensitive sensor includes a photosensitive semiconductor layer, an orthographic projection of the photosensitive semiconductor layer in each photosensitive sensor on the base is outside a range of the orthographic projection of any one of the at least one light-shielding portion on the base.

In some embodiments, the display substrate further includes a plurality of color filter portions disposed at the side of the at least one photosensitive sensor away from the base. An orthographic projection of each of the plurality of light-emitting devices on the base is within a range of an orthographic projection of one of the plurality of color filter portions on the base. An orthographic projection of each of the at least one photosensitive sensor on the base is within the range of the orthographic projection of one of the plurality of color filter portions on the base, or partially overlaps with the orthographic projection of one of the plurality of color filter portions on the base.

In some embodiments, the at least one light-shielding portion includes a plurality of light-shielding portions arranged in an array. One color filter portion is a range of between any two adjacent light-shielding portions along a row direction or a column direction, and an orthographic projection of a region between any two adjacent light-shielding portions on the base is within a range of an orthographic projection of the color filter portion on the base.

In some embodiments, the display substrate further includes: a first planarization layer disposed between the plurality of color filter portions and the at least one photosensitive sensor. In a case where the display substrate further includes at least one touch structure, the at least one touch structure is located on a side of the first planarization layer proximate to the at least one photosensitive sensor.

In some embodiments, in a case where the display substrate further includes at least one light-shielding portion, the at least one light-shielding portion is located on a side of the first planarization layer proximate to the plurality of color filter portions.

In some embodiments, the display panel further includes a second planarization layer disposed on a side of the plurality of color filter portions away from the base. In a case where the display substrate further includes at least one light-shielding portion, the at least one light-shielding portion is located on a side of the second planarization layer proximate to the plurality of color filter portions.

In another aspect, a method of manufacturing a display substrate is provided. The method of manufacturing the display substrate includes: providing a base; forming a plurality of light-emitting devices on the base; forming an encapsulation layer on a side of the plurality of light-emitting devices away from the base; and forming at least one photosensitive sensor on a surface of the encapsulation layer away from the base. Each of the at least one photosensitive sensor is configured to collect optical signals for texture recognition.

In some embodiments, the method of manufacturing the display substrate further includes: forming at least one touch structure at a side of the encapsulation layer away from the base. An orthographic projection of any one of the at least one touch structure on the base is nonoverlapping with an orthographic projection of each photosensitive sensor on the base.

In some embodiments, forming at least one photosensitive sensor on the surface of the encapsulation layer away from the base includes: forming a first conductive layer on the surface of the encapsulation layer away from the base and patterning the first conductive layer to form at least one control electrode; forming a first insulating layer on a surface of the at least one control electrode away from the encapsulation layer; forming at least one photosensitive semiconductor layer that is in one-to-one correspondence with the at least one control electrode on a surface of the first insulating layer away from the at least one control electrode; and forming a second conductive layer on a side of the at least one photosensitive semiconductor layer away from the first insulating layer and patterning the second conductive layer to form a first electrode and a second electrode that are electrically connected to each of the at least one photosensitive semiconductor layer.

In some embodiments, each photosensitive sensor includes: a control electrode, a first insulating layer and a photosensitive semiconductor layer that are sequentially stacked on top of one another in a direction away from the base; and a first electrode and a second electrode electrically connected to the photosensitive semiconductor layer.

The display substrate further includes at least one touch structure, and each of the at least one touch structure includes a third electrode and a fourth electrode that are insulated from each other. The third electrode includes two third sub-electrodes arranged in a same layer as the fourth electrode, and a bridging sub-electrode electrically connected to the two third sub-electrodes. The bridging sub-electrode and the fourth electrode are arranged in different layers and are insulated from each other.

Forming the at least one touch structure on the side of the encapsulation layer away from the base further includes: forming the first conductive layer on the side of the encapsulation layer away from the base and patterning the first conductive layer to form the at least one control electrode and the at least one bridging sub-electrode; and forming the second conductive layer on the side of the at least one photosensitive semiconductor layer away from the first insulating layer and patterning the second conductive layer to form the first electrode and the second electrode that are electrically connected to each photosensitive semiconductor layer, the two third sub-electrodes electrically connected to each bridging sub-electrode, and the fourth electrode corresponding to each bridging sub-electrode.

In some embodiments, each photosensitive sensor includes: a control electrode, a first insulating layer and a photosensitive semiconductor layer that are sequentially stacked on top of one another in a direction away from the base; and a first electrode and a second electrode electrically connected to the photosensitive semiconductor layer.

The display substrate further includes at least one touch structure, and each of the at least one touch structure includes a third electrode and a fourth electrode that are insulated from each other. The third electrodes includes two third sub-electrodes arranged in a same layer as the fourth electrode, and a bridging sub-electrode electrically connected to the two third sub-electrodes. The bridging sub-electrode and the fourth electrode are arranged in different layers and are insulated from each other.

Forming the at least one touch structure on the side of the encapsulation layer away from the base further includes: forming the second conductive layer on a side of the at least one photosensitive conductor layer away from the first insulating layer and patterning the second conductive layer to form at least one bridging sub-electrode, and the first electrode and the second electrode that are electrically connected to each photosensitive conductor layer; and forming a third conductive layer on a side of the at least one bridging sub-electrode away from the first insulating layer and patterning the third conductive layer to form the two third sub-electrodes electrically connected to each bridging sub-electrode, and the fourth electrode corresponding to each bridging sub-electrode.

In some embodiments, forming the second conductive layer on the side of the at least one photosensitive semiconductor layer away from the first insulating layer and patterning the second conductive layer further includes: forming at least one scanning signal line, each of the at least one scanning signal line being electrically connected to at least one first electrode; and forming at least one common electrode line, each of the at least one common electrode line being electrically connected to at least one second electrode.

In some embodiments, the method of manufacturing the display substrate further includes: forming at least one light-shielding portion at a side of the at least one photosensitive sensor away from the base. An orthographic projection of each photosensitive sensor on the base is nonoverlapping with or partially overlaps with an orthographic projection of any one of the at least one light-shielding portion on the base.

In some embodiments, the method of manufacturing the display substrate further includes: forming a plurality of color filter portions at the side of the at least one photosensitive sensor away from the base. An orthographic projection of each of the plurality of light-emitting devices on the base is within a range of an orthographic projection of one of the plurality of color filter portions on the base. An orthographic projection of each of the at least one photosensitive sensor on the base is within the range of the orthographic projection of one of the plurality of color filter portions on the base, or partially overlaps with the orthographic projection of one of the plurality of color filter portions on the base.

In yet another aspect, a display device is provided. The display device includes the display substrate as described in some embodiments above.

BRIEF DESCRIPTION OF THE DRAWINGS

In order to describe technical solutions in some embodiments of the present disclosure more clearly, the accompanying drawings to be used in the description of some embodiments will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in some embodiments of the present disclosure will be described clearly and completely in combination with the accompanying drawings in some embodiments of the present disclosure. Obviously, the described embodiments are merely some but not all of the embodiments of the present disclosure. All other embodiments made on the basis of some embodiments of the present disclosure by a person of ordinary skill in the art without paying any creative effort shall be included in the protection scope of the present disclosure.

As people are pursuing mobile phones and other electronic products with a high screen-to-body ratio, under-screen fingerprint recognition technology has come into being. The under-screen fingerprint recognition technology has the advantages of good appearance, convenience, quick unlocking, conformity with users' habits, etc. in actual application. Currently, optical fingerprint recognition is a mainstream under-screen fingerprint recognition technology. Realization of optical fingerprint recognition usually requires support of an ultra-thin organic light-emitting diode (OLED) display panel.

Figure 1:
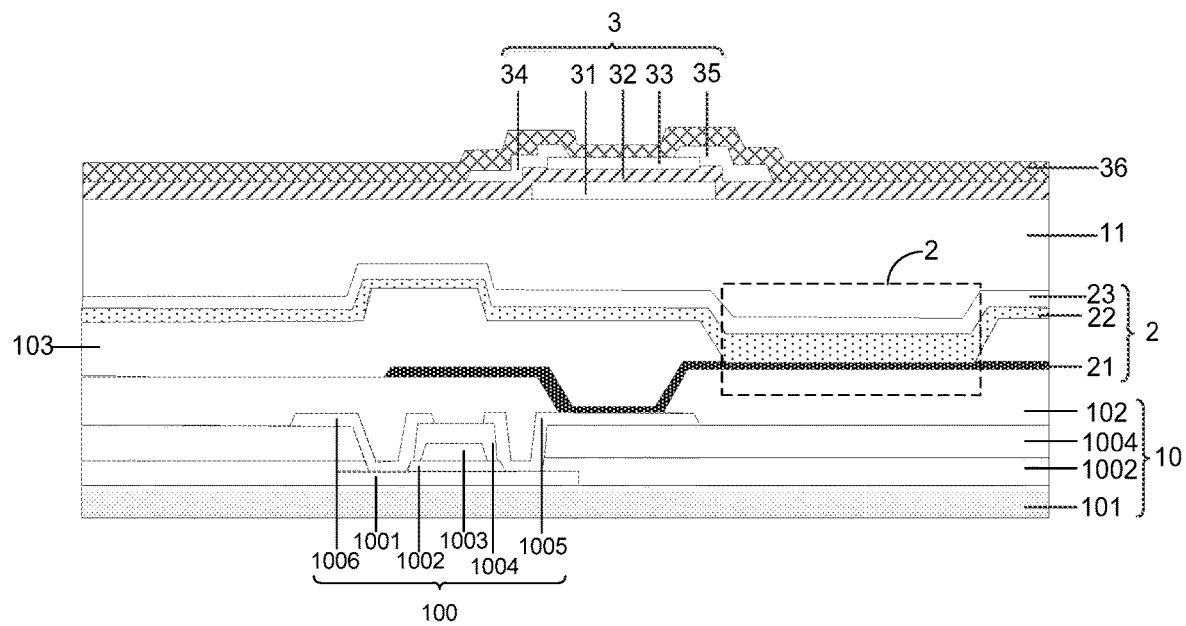
FIG. 1 is a schematic partial sectional view of a display substrate, according to some embodiments of the present disclosure.

Some embodiments of the present disclosure provide a display substrate. Referring to FIG. 1, the display substrate includes a base 10, a plurality of light-emitting devices 2 disposed on the base 10, an encapsulation layer 11 disposed on a light-emitting side of the plurality of light-emitting devices 2 away from the base 10, and at least one photo-sensitive sensor 3 disposed on a surface of the encapsulation layer 11 away from the base 10. Each of the at least one photosensitive sensor 3 is configured to collect optical signals for texture recognition.

Figure 2:
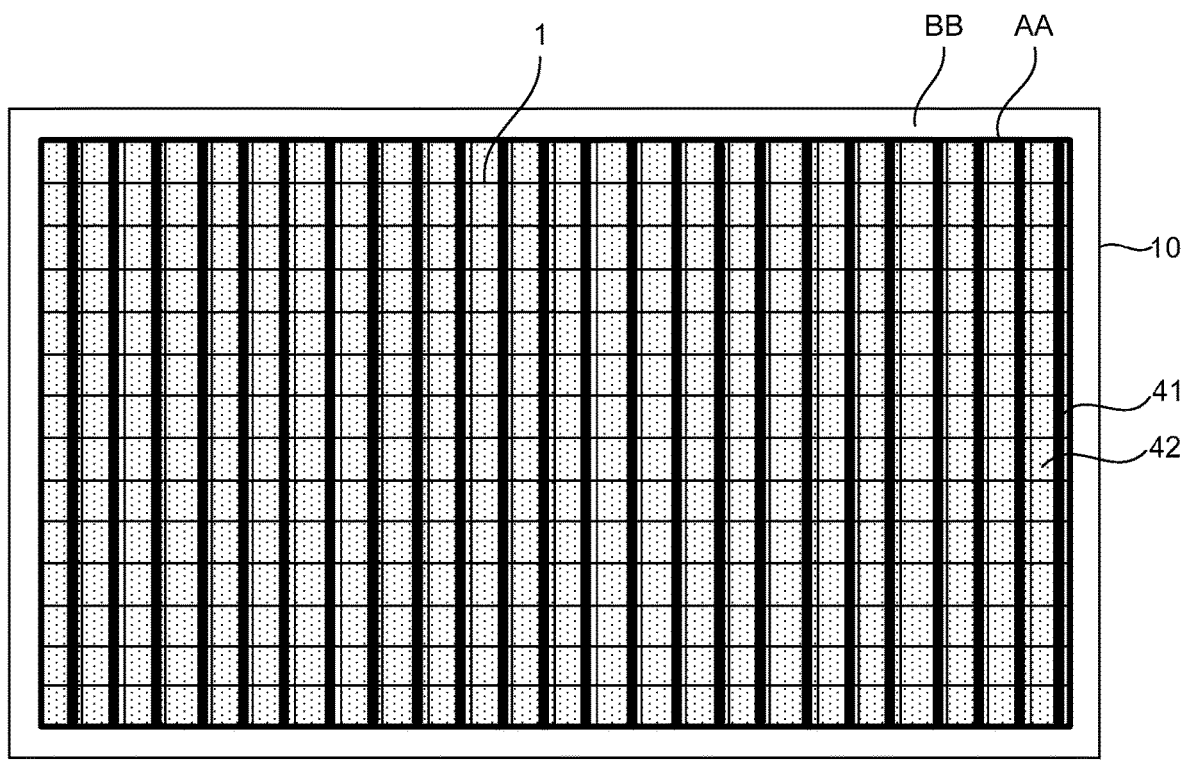
FIG. 2 is a schematic top view of a display substrate, according to some embodiments of the present disclosure.

Referring to FIG. 2, the display substrate has a display area AA and a non-display area BB located around the display area. The display substrate includes a plurality of sub-pixels 1 arranged in an array in the display area AA, and each sub-pixel 1 is correspondingly provided with a light-emitting device 2 therein. FIG. 1 is only a partial sectional view of a single sub-pixel 1 of the display substrate provided in some embodiments of the present disclosure, and does not show a distribution and structure of all sub-pixels 1 in the display area.

The base 10 serves as a base substrate of the display substrate. The base 10 is a blank substrate on which no electronic device or circuit structure is manufactured, or an array substrate on a surface of which electronic device(s) or circuit structure(s) are manufactured according to actual needs.

In some examples, the base 10 includes: a substrate 101, a pixel circuit layer, and a passivation layer 102. The pixel circuit layer and the passivation layer 102 are sequentially stacked on top of one another on the substrate 101 in a direction away from the substrate 101. A material of the passivation layer 102 is a material that can be patterned by an exposure or development process. For example, the material of the passivation layer 102 is a photoresist or a resin material with properties similar to the photoresist.

The pixel circuit layer includes a plurality of pixel driving circuits. The plurality of pixel driving circuits are in one-to-one correspondence with the plurality of sub-pixels 1, and each pixel driving circuit is electrically connected to a light-emitting device 2 in a corresponding sub-pixel 1. Each pixel driving circuit includes at least one thin film transistor 100. Each light-emitting device 2 is electrically connected to a thin film transistor 100 in a corresponding pixel driving circuit.

Of course, each pixel driving circuit is not limited to only include at least one thin film transistor 100. For example, each pixel driving circuit further includes at least one storage capacitor. Some embodiments of the present disclosure do not limit a structure of each pixel driving circuit, as long as the pixel driving circuit is capable of driving a corresponding light-emitting device 2 to emit light.

Herein, the thin film transistor 100 may have either a top gate structure or a bottom gate structure, which is not limited in some embodiments of the present disclosure. A structure of each thin film transistor 100 may be set according to actual needs. FIG. 1 is an illustration by taking an example in which the thin-film transistor 100 has a top-gate structure.

For example, as shown in FIG. 1, each thin film transistor 100 includes: an active layer 1001, a gate insulating layer 1002, a gate 1003, an interlayer insulating layer 1004, a source 1005, and a drain 1006. The active layer 1001, the gate insulating layer 1002, the gate 1003 and the interlayer insulating layer 1004 are sequentially stacked on top of one another on the substrate 101. The source 1005 and the drain 1006 are arranged in a same layer, and are both electrically connected to the active layer 1001.

In some examples, the display substrate further includes a pixel defining layer 103 disposed on a side of the passivation layer 102 away from the substrate 101. The pixel defining layer 103 includes a plurality of openings therein configured to define a plurality of sub-pixels 1. A single light-emitting device 2 is correspondingly provided in a single opening.

In addition to display, light emitted from the light-emitting devices 2 can also be used for texture recognition. Herein, texture recognition includes fingerprint recognition. Some embodiments of the present disclosure are described by taking an example in which the light emitted from the light-emitting devices 2 is used for fingerprint recognition. The light emitted from the light-emitting devices 2 is reflected by a finger to at least one photosensitive sensor 3 in a corresponding region, thereby realizing collection of fingerprint recognition optical signals (reflection light of the light emitted from the light emitting devices 2 reflected by a fingerprint of the finger) by the photosensitive sensor(s) 3.

For example, during a process in which the fingerprint recognition optical signals are being collected, light emitted from at least one light-emitting device 2 located in a fingerprint recognition region reaches the finger. Ridges of the fingerprint are in direct contact with a display surface of the display substrate, and can reflect the light emitted from the light-emitting devices 2 to the photosensitive sensor(s) 3 in the corresponding region. Since there is air between valleys of the fingerprint and the display surface of the display substrate, it is difficult for the light emitted from the light-emitting devices 2 to be reflected by the valleys of the fingerprint to the photosensitive sensor(s) 3 in the corresponding region after reaching the finger. In this way, the photosensitive sensor(s) 3 may be able to effectively collect the fingerprint recognition optical signals according to how the light emitted from the light-emitting devices 2 is reflected by the fingerprint.

In some embodiments, each light-emitting device 2 is an OLED. Each light-emitting device 2 includes an anode 21 and a cathode 23 that are arranged opposite to each other, and an organic light-emitting layer 22 filled between the anode 21 and the cathode 23. The organic light-emitting layer 22 has a single-layer structure or a multilayer structure. For example, the organic light-emitting layer 22 includes a hole injection layer, a hole transport layer, a light-emitting material layer, an electron transport layer, and an electron injection layer that are sequentially stacked. Some embodiments of the present disclosure do not limit a structure of the light-emitting device 2, as long as the light-emitting device 2 can emit light.

For example, each light-emitting device 2 is a top-emission OLED. A cathode 23 of each OLED is transparent, and its material is at least one of indium tin oxide (ITO), indium zinc oxide (IZO), or other transparent conductive materials. An anode 21 of each OLED is opaque, and its material is a metal material. For example, the material of the anode 21 is at least one of silver (Ag), aluminum (Al), molybdenum (Mo), copper (Cu), or chromium (Cr). The anode 21 is made of a metal material having a high reflectivity. In this way, a light-emitting efficiency of a corresponding light-emitting device 2 may be improved.

In addition, anodes 21 of the light-emitting devices 2 are insulated from each other. The anode 21 of each light-emitting device 2 passes through a corresponding via hole provided in the passivation layer 102 to be electrically connected to the source 1005 of the corresponding thin film transistor 100.

In some embodiments, a plurality of photosensitive sensors 3 are correspondingly provided in a single sub-pixel 1; or a single photosensitive sensor 3 is correspondingly provided in a single sub-pixel 1; or a plurality of sub-pixels 1 correspond to a single photosensitive sensor 3. Some embodiments of the present disclosure do not limit the structure and number of the photosensitive sensors 3 and a corresponding relationship between the photosensitive sensors 3 and the sub-pixels 1, as long as the photosensitive sensors 3 can collect fingerprint recognition optical signals. For the sake of clarity, some embodiments of the present disclosure are described by taking an example in which a single photosensitive sensor 3 is correspondingly provided in a single sub-pixel 1.

Referring to FIG. 1, in some embodiments of the present disclosure, the photosensitive sensor 3 is disposed on the surface of the encapsulation layer 11 away from the base 10, i.e., disposed at the light-emitting side of the light-emitting devices 2. In this way, it may be possible to prevent opaque electrodes (such as the anodes 21) in the light-emitting devices 2 from blocking the fingerprint recognition optical signals to be collected by the corresponding photosensitive sensors 3, and thus ensure that the photosensitive sensors 3 may effectively collect the fingerprint recognition optical signals. In addition, in some embodiments of the present disclosure, placing the photosensitive sensors 3 on the surface of the encapsulation layer 11 of the display substrate is also conducive to realizing ultra-thin display substrates.

In some embodiments, the photosensitive sensor 3 includes: a control electrode 31, a first insulating layer 32, and a photosensitive semiconductor layer 33 that are sequentially stacked on top of one another in a direction away from the base 10; and a first electrode 34 and a second electrode 35 that are electrically connected to the photosensitive semiconductor layer 33.

It will be noted that the control electrode 31 of the photosensitive sensor 3 is usually made of a conductive metal material, so that the control electrode 31 has a light-shielding function. Thus, in some examples, an orthographic projection of the photosensitive semiconductor layer 33 on the base 10 is within a range of an orthographic projection of the control electrode 31 on the base 10. In this way, it may be possible to effectively prevent light from entering the photosensitive semiconductor layer 33 from a side of the photosensitive semiconductor layer 33 proximate to the control electrode 31.

Herein, the photosensitive sensor 3 is a photosensitive transistor. The control electrode 31 is a gate, and the first insulating layer 32 is a gate insulating layer. The first electrode 34 is a source and the second electrode 35 is a drain; or, the first electrode 34 is a drain and the second electrode 35 is a source.

In a non-operating state, the photosensitive transistor has a large resistance and a low on-state current. The photosensitive transistor generates photo-generated carriers when receiving the fingerprint recognition optical signals, which greatly increases its on-state current. In this way, the photosensitive transistor may be able to convert the fingerprint recognition optical signals into fingerprint recognition electrical signals under the control of its gate, and output the fingerprint recognition electrical signals in the form of current.

Figure 3:
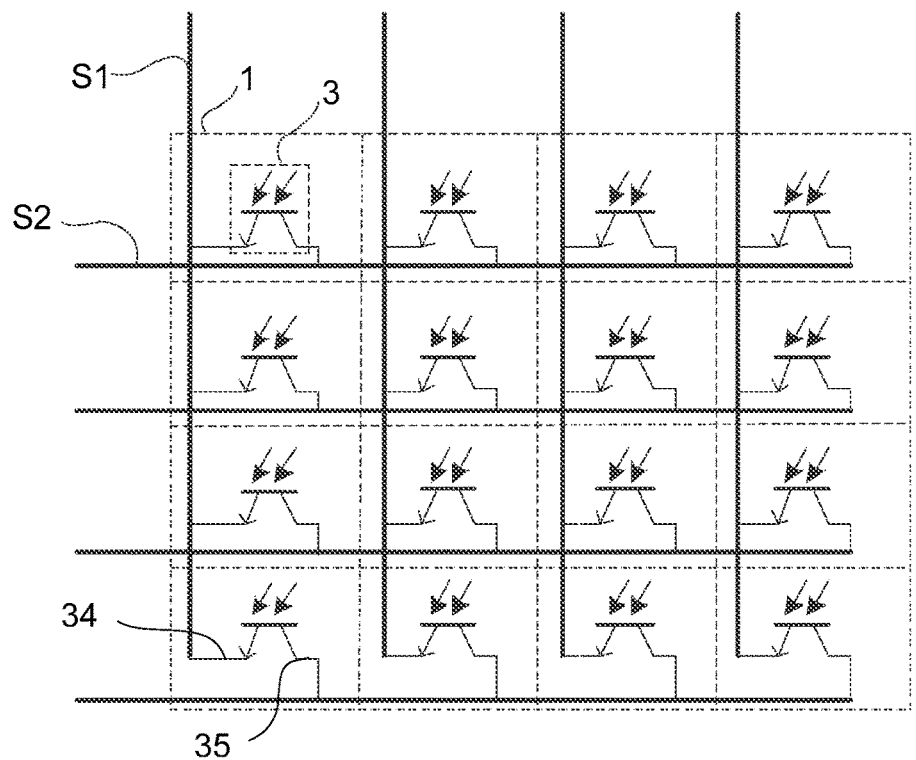
FIG. 3 is a schematic partial top view of a display substrate, according to some embodiments of the present disclosure.

Based on this, referring to FIG. 3, in the display substrate, the first electrode 34 in at least one photosensitive sensor 3 is electrically connected to a scanning signal line S1, and the second electrode 35 in at least one photosensitive sensor 3 is electrically connected to a common electrode line S2.

For example, the display substrate includes a plurality of sub-pixels 1 arranged in an array in the display area, and a single photosensitive sensor 3 is correspondingly provided in each sub-pixel 1. First electrodes 34 in at least one row are electrically connected to a scanning signal line S1, and second electrodes 35 in at least one column are electrically connected to a common electrode line S2; or, first electrodes 34 in at least one column are electrically connected to a scanning signal line S1, and second electrodes 35 in at least one row are electrically connected to a common electrode line S2. In this way, a structure of a wire arrangement of the display substrate may be simplified.

Herein, scanning signal lines S1, common electrode lines S2, the first electrodes 34, and the second electrodes 35 are arranged in a same layer. That is, they are made of a same material and formed by a single patterning process, which is conducive to simplifying a manufacturing process of the display substrate. The patterning process includes a photolithography process, or a process including a photolithography process and an etching process. The photolithography process refers to a process that includes a film formation (e.g., a film formation by chemical vapor deposition (CVD)), an exposure, a development, and the like, and that forms a pattern by using a photoresist, a mask, an exposure machine, etc.

In addition, the common electrode lines are configured to provide a common voltage signal, that is, a stable voltage signal. The common electrode lines are electrically connected to each other or have an integrative structure. The scanning signal lines are electrically connected to a control integrated circuit (control IC) located in the non-display area BB of the display substrate. Each photosensitive transistor can transmit the fingerprint recognition electrical signals converted by the photosensitive transistor to the control IC through a scanning signal line correspondingly connected to the photosensitive transistor, so that the control IC performs fingerprint recognition according to the fingerprint recognition electrical signals.

Figure 4:
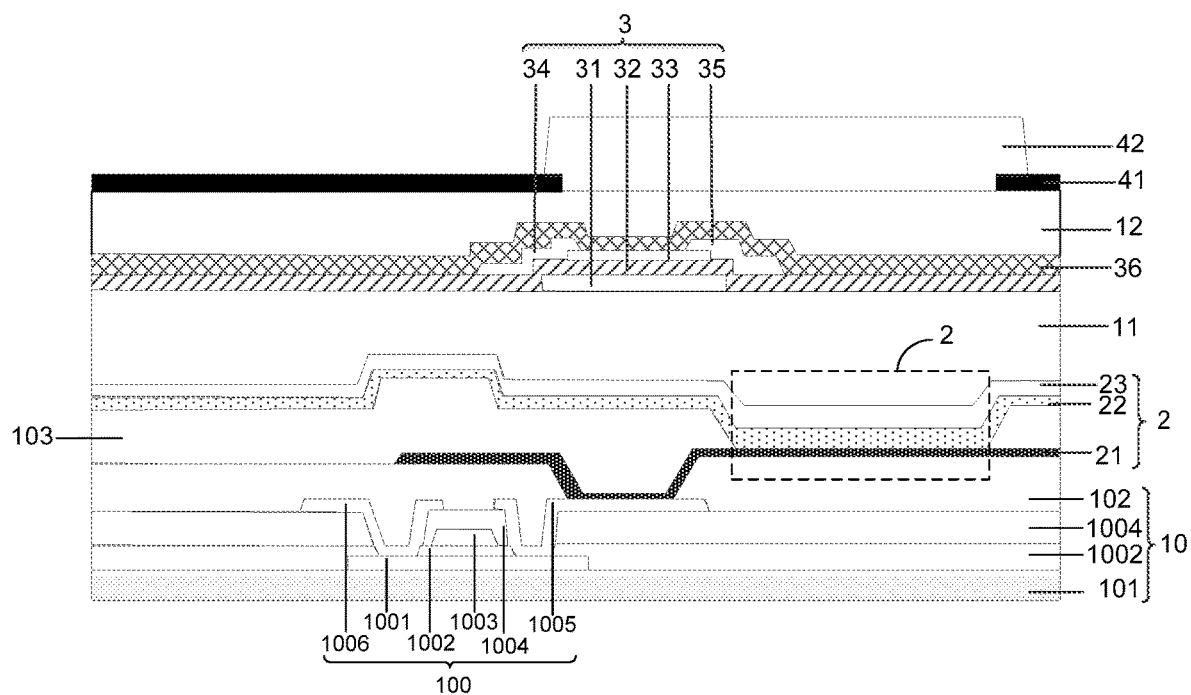
FIG. 4 is a schematic partial sectional view of another display substrate, according to some embodiments of the present disclosure.

In some embodiments, referring to FIG. 4, the display substrate further includes at least one light-shielding portion 41. Each of the at least one light-shielding portion 41 is disposed at a side of the at least one photosensitive sensor 3 away from the base 10. The light-shielding portion 41 is made of a light-shielding material with a light transmittance less than or equal to 10%, for example, a black resin material. For example, the light-shielding portions 41 are a black matrix.

A position of the at least one light-shielding portion 41 in the display substrate is generally set according to actual needs. For example, an orthographic projection of each thin film transistor 100 in each pixel driving circuit on the substrate 101 is within a range of an orthographic projection of a light-shielding portion 41 corresponding to the same sub-pixel 1 on the substrate 101. In this way, it may be possible to ensure that each light-shielding portion 41 shields each thin-film transistor 100 in a corresponding pixel driving circuit from light, and thus prevents light from affecting an electrical conductivity of each thin-film transistor 100. For example, light may cause a threshold voltage drift of the thin-film transistor 100, and thus may reduce the electrical conductivity of the thin film transistor 100.

With continued reference to FIG. 4, in some examples, an orthographic projection of each photosensitive sensor 3 on the base 10 is nonoverlapping with an orthographic projection of any one of the at least one light-shielding portion 41 on the base 10. In other examples, the orthographic projection of each photosensitive sensor 3 on the base 10 partially overlaps with an orthographic projection of one of the at least one light-shielding portion 41 on the base 10. In this way, it may be possible to prevent the light-shielding portion 41 from blocking the fingerprint recognition optical signals to be collected by the photosensitive sensor 3, and thereby ensure that the photosensitive sensor 3 may effectively collect the fingerprint recognition optical signals.

It will be noted that the photosensitive semiconductor layer 33 is an effective component of the photosensitive sensor 3 for fingerprint collection. Based on this, an orthographic projection of the photosensitive semiconductor layer 33 in each photosensitive sensor 3 on the base 10 is outside a range of the orthographic projection of any one of the at least one light-shielding portion 41 on the base 10. That is, the photosensitive semiconductor layer 33 in each photosensitive sensor 3 is not blocked by any light-shielding portion 41. In this case, it may be ensured that each photosensitive sensor 3 may sufficiently collect fingerprint recognition optical signals.

In some embodiments, referring to FIG. 4, the display substrate further includes a plurality of color filter portions 42. Each of the plurality of color filter portions 42 is disposed at the side of the at least one photosensitive sensor 3 away from the base 10.

Herein, the plurality of color filter portions 42 are made of filter materials of different colors. In a case where the display substrate adopts a RGB color model, the plurality of color filter portions 42 include red filter portion(s), green filter portion(s), and blue filter portion(s). Each color filter portion 42 is usually located in an opening region of a corresponding sub-pixel 1. That is, an orthographic projection of the light-emitting device 2 in each sub-pixel on the base 10 is within a range of an orthographic projection of a corresponding color filter portion 42 on the base 10. In this way, the light emitted from the light-emitting device 2 may be able to pass through the corresponding color filter portion 42 to achieve color display of the display substrate.

With continued reference to FIG. 4, the orthographic projection of each of the at least one photosensitive sensor 3 on the base 10 is within a range of an orthographic projection of one of the plurality of color filter portions 42 on the base 10, or partially overlaps with the orthographic projection of one of the plurality of color filter portions 42 on the base 10. In this way, it may be possible to ensure that the fingerprint recognition optical signals are effectively collected by the corresponding photosensitive sensor 3 after passing through the color filter portion 42.

In addition, in the display substrate, by providing the color filter portions 42 above the encapsulation layer 11 of the display substrate (which is referred to as Color Filter on Encapsulation, or COE), it may also be possible to effectively reduce a thickness of the display substrate and thereby improve a bendability of the display substrate, which is conducive to realizing ultra-thin display substrates.

In some examples, the light-shielding portions 41 are a black matrix. Referring to FIGS. 2 and 4, the plurality of light-shielding portions 41 are arranged in an array, and a region in each sub-pixel 1 that is not blocked by the light-shielding portion 41 is the opening region of the sub-pixel 1. A color filter portion 42 is disposed between any two adjacent light-shielding portions 41 along a row direction or a column direction, and an orthographic projection of a region between any two adjacent light-shielding portions 41 on the base 10 is within a range of an orthographic projection of the color filter portion 42 on the base 10. That is, each color filter portion 42 covers the opening region of a corresponding sub-pixel 1.

Figure 5:
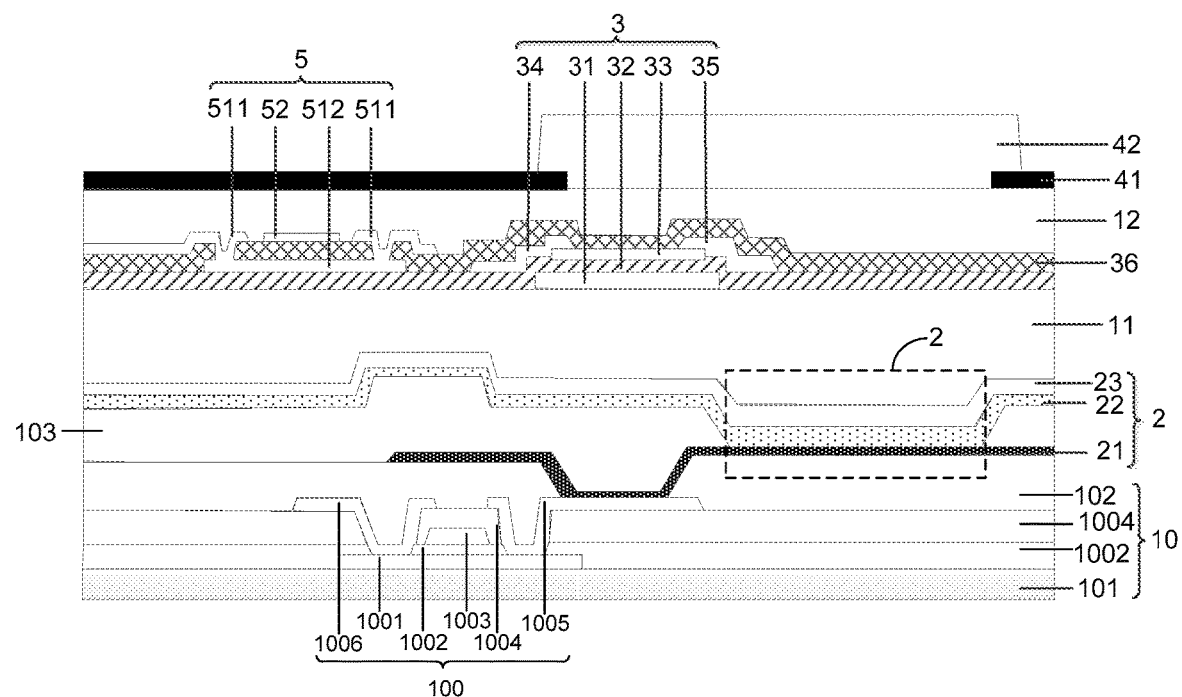
FIG. 5 is a schematic partial sectional view of yet another display substrate, according to some embodiments of the present disclosure.

In some embodiments, referring to FIG. 5, the display substrate further includes: at least one touch structure 5 disposed at a side of the encapsulation layer 11 away from the base 10. An orthographic projection of any one of the at least one touch structure 5 on the base 10 is nonoverlapping with the orthographic projection of each photosensitive sensor 3 on the base 10. In this way, it may be possible to prevent any touch structure 5 from blocking the fingerprint recognition optical signals to be collected by the photosensitive sensor 3, and thereby ensure that the photosensitive sensor 3 may effectively collect the fingerprint recognition optical signals. In addition, by placing the touch structure 5 above the encapsulation layer 11 of the display substrate (which is referred to as Touch on Thin Film Encapsulation, or TOT), it may also be possible to effectively reduce the thickness of the display substrate and improve the bendability of the display substrate, which is conducive to realizing ultra-thin display substrates.

With continued reference to FIG. 5, an orthographic projection of each of the at least one touch structure 5 on the base 10 is within a range of the orthographic projection of one of the at least one light-shielding portion 41 on the base 10, and the at least one touch structure 5 is located at a side of a corresponding light-shielding portion 41 proximate to the base 10. In this way, it may not only be possible to use the light-shielding portion 41 to prevent a corresponding touch structure 5 from affecting the display effect of the display substrate through reflection of external light, but it may also be possible to use the light-shielding portion 41 to block the corresponding touch structure 5 and prevent the touch structure 5 from being exposed, and thus improve an aesthetic of the display substrate.

Some embodiments of the present disclosure do not limit a structure and the number of the touch structures 5 and a corresponding relationship between the touch structures 5 and the sub-pixels 1, as long as the touch structures 5 can realize a touch function. For the sake of clarity, some embodiments of the present disclosure are described by taking an example in which a single touch structure 5 is correspondingly provided in a single sub-pixel 1.

In some embodiments, referring to FIG. 5, each touch structure 5 includes a third electrode 51 and a fourth electrode 52 that are insulated from each other. The third electrode 51 includes two third sub-electrodes 511 arranged in a same layer as the fourth electrode 52, and a bridging sub-electrode 512 electrically connected to the two third sub-electrodes 511. The bridging sub-electrode 512 and the fourth electrode 52 are arranged in different layers and are insulated from each other. Herein, the description "arranged in a same layer" means that the elements are made of a same material and formed by a single patterning process. The description "arranged in different layers and are insulated from each other" means that the elements are formed in different patterning processes, and are made of a same material or different materials.

In some examples, the third electrode 51 and the fourth electrode 52 in each touch structure 5 cross and are insulated from each other. Third electrodes 51 in a plurality of touch structures 5 in a same row are electrically connected to each other in sequence, and are electrically connected to the control IC through a corresponding first signal line. The first signal line is configured to receive a touch driving signal Tx output by the control IC. Fourth electrodes 52 in a plurality of touch structures 5 in a same column are electrically connected to each other in sequence, and are electrically connected to the control IC through a corresponding second signal line. The second signal line is configured to output a touch sensing signal Rx to the control IC.

The third electrodes 51 and the fourth electrodes 52 in the plurality of touch structures 5, and the control electrodes 31, the first electrodes 34 and the second electrodes 35 in the plurality of photosensitive sensors 3 are all made of conductive materials, such as metal materials. Therefore, some electrodes in the plurality of touch structures 5 and some electrodes in the plurality of photosensitive sensors 3 may be arranged in a same layer, that is, may be made of a same material and formed by a single patterning process.

Figure 6:
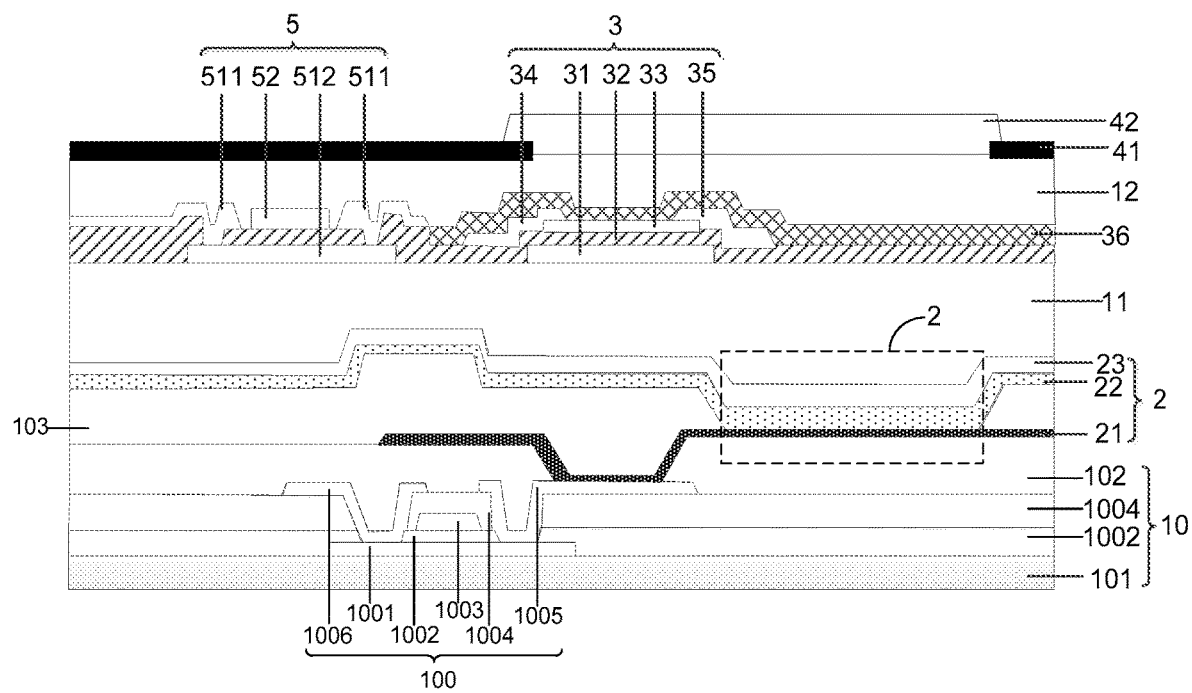
FIG. 6 is a schematic partial sectional view of yet another display substrate, according to some embodiments of the present disclosure.

In some examples, referring to FIG. 6, the control electrode 31 in the photosensitive sensor 3 and the bridging sub-electrode 512 in the touch control structure 5 are arranged in a same layer. The control electrode 31 in the photosensitive sensor 3 is insulated from the bridging sub-electrode 512 in the touch structure 5 by the first insulating layer 32. The first electrode 34 and the second electrode 35 in the photosensitive sensor 3 are arranged in a same layer as the fourth electrode 52 in the touch structure 5. The first electrode 34 and the second electrode 35 in the photosensitive sensor 3 are insulated from the fourth electrode 52 in the touch structure 5 by a second insulating layer 36. In this way, it may be possible to reduce the number of electrode layers required to be formed in the display substrate, reduce the number of corresponding patterning processes, and thus simplify the manufacturing process of the display substrate. It is also conducive to realizing ultra-thin display substrates.

In other examples, referring to FIG. 5, the first electrode 34 and the second electrode 35 in the photosensitive sensor 3 are arranged in a same layer as the bridging sub-electrode 512 in the touch structure 5. The first electrode 34 and the second electrode 35 in the photosensitive sensor 3 are insulated from the bridging sub-electrode 512 in the touch structure 5 by the second insulating layer 36. The first electrode 34 in each photosensitive sensor 3 is electrically connected to a corresponding scanning signal line, the second electrode 35 in each photosensitive sensor 3 is electrically connected to a corresponding common electrode line, and the scanning signal lines and the common electrode lines cross to form a grid. Moreover, the bridging sub-electrode 512 in each touch structure 5 is in a shape of an island. Therefore, by arranging the first electrode 34 and the second electrode 35 in the photosensitive sensor 3 in the same layer as the bridging sub-electrode 512 in the touch structure 5, it may be possible to facilitate a design of the wire arrangement to reduce a difficulty of the design, and simplify the manufacturing process of the display substrate. In addition, in this way, it may also be possible to reduce the number of electrode layers required to be formed in the display substrate, and thus make it easier to realize ultra-thin display substrates.

In some embodiments, referring to FIG. 5, the display substrate further includes: a first planarization layer 12 disposed between the plurality of color filter portions 42 and the at least one photosensitive sensor 3. The at least one touch structure 5 is located on a side of the first planarization layer 12 proximate to the at least one photosensitive sensor 3. That is to say, the photosensitive sensors 3 and the touch structures 5 are located on a same side of the first planarization layer 12. The first planarization layer 12 is used to planarize surfaces of the photosensitive sensors 3 and the touch structures 5, and ensure that the color filter portions 42 are formed on a flat surface of the first planarization layer 12. In this way, it may be possible to ensure that light emitted from each light-emitting device 2 enters a corresponding color filter portion 42 from a same plane, and thereby ensure uniform display of the display substrate.

In addition, the display substrate further includes at least one light-shielding portion 41. The at least one light-shielding portion 41 is located on a side of the first planarization layer 12 proximate to the plurality of color filter portions 42. That is to say, the light-shielding portions 41 and the color filter portions 42 are located on a same side of the first planarization layer 12. In this way, in a case where the light-shielding portions 41 are a black matrix made of black resin, the light-shielding portions 41 and the color filter portions 42 may be formed by using a same manufacturing process, and may be able to protect the photosensitive sensors 3 and the touch structures 5 in the manufacturing process, so as to prevent the manufacturing process from affecting a reliability of the photosensitive sensors 3 and the touch structures 5.

Figure 7:
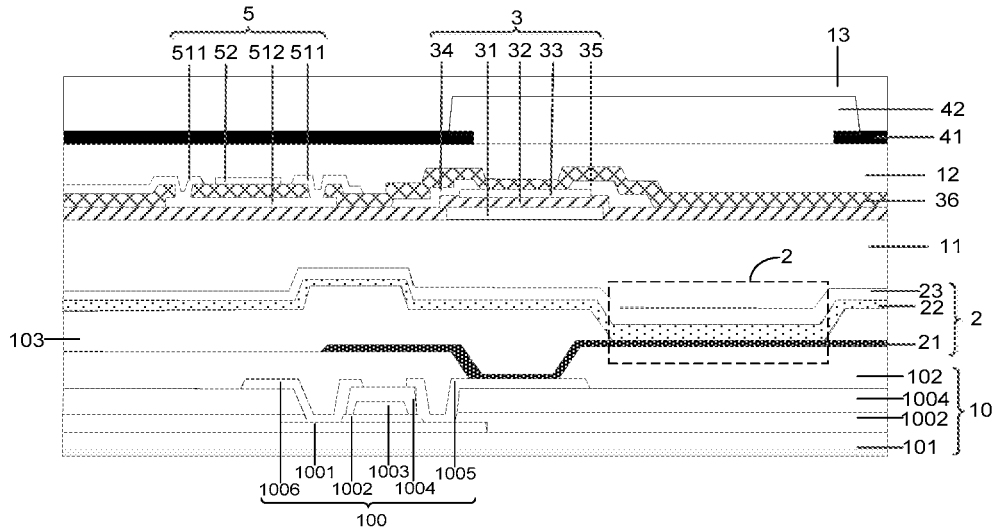
FIG. 7 is a schematic partial sectional view of yet another display substrate, according to some embodiments of the present disclosure.

In some embodiments, referring to FIG. 7, the display substrate further includes a second planarization layer 13 disposed on a side of the plurality of color filter portions 42 away from the base 10. In a case where the display substrate further includes at least one light-shielding portion 41, the at least one light-shielding portion 41 is located on a side of the second planarization layer 13 proximate to the plurality of color filter portions 42. Herein, the second planarization layer 13 is used to ensure that the display substrate has a flat display surface. For example, the second planarization layer 13 is made of glass, and the second planarization layer 13 may be equivalent to a display cover plate.

Figure 8:
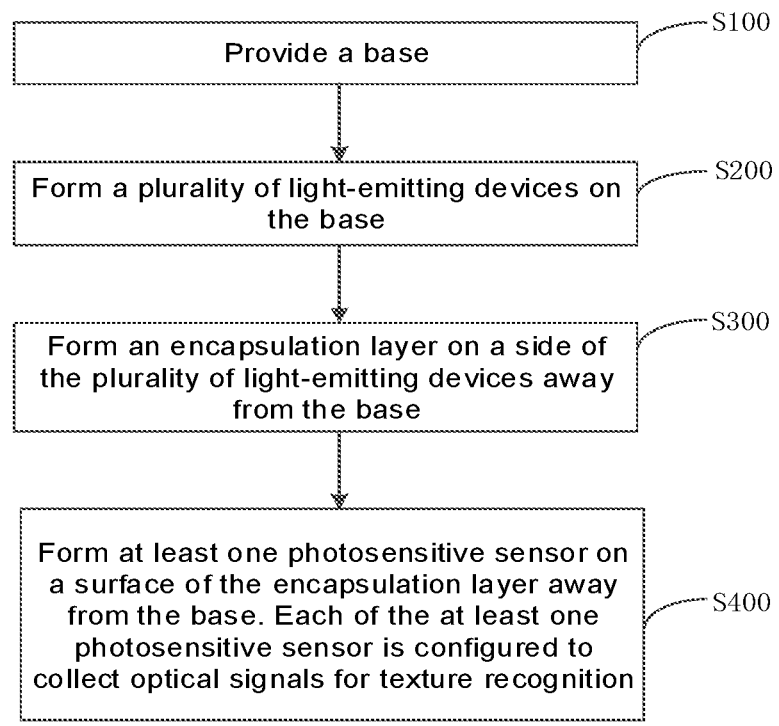
FIG. 8 is a flow chart of a method of manufacturing a display substrate, according to some embodiments of the present disclosure.

Some embodiments of the present disclosure provide a method of manufacturing a display substrate. Referring to FIG. 8, the method of manufacturing the display substrate includes S100 to S400.

In S100, a base 10 is provided.

The base 10 serves as a base substrate of the display substrate. The base 10 is a blank substrate on which no electronic device or circuit structure is manufactured, or an array substrate on a surface of which electronic device(s) or circuit structure(s) are manufactured according to actual needs. For example, the base 10 is an array substrate including a substrate 101, a pixel circuit layer, and a passivation layer 102.

In S200, a plurality of light-emitting devices 2 are formed on the base 10.

The display substrate has a display area AA and a non-display area BB located around the display area. The display substrate includes a plurality of sub-pixels 1 arranged in an array in the display area AA, and each sub-pixel 1 is correspondingly provided with a light-emitting device 2 therein.

In S300, an encapsulation layer 11 is formed on a side of the plurality of light-emitting devices 2 away from the base 10.

The light-emitting device 2 is, for example, an OLED. By forming the encapsulation layer 11 on the side of the light-emitting devices 2 away from the base 10, it may be possible to use the encapsulation layer 11 to prevent water and oxygen from eroding the light-emitting devices, so as to protect the light-emitting devices 2.

In S400, at least one photosensitive sensor 3 is formed on a surface of the encapsulation layer 11 away from the base 10, and each of the at least one photosensitive sensor 3 is configured to collect optical signals for texture recognition.

The method of manufacturing the display substrate has the same beneficial effects as the display substrate described above, and details are not described herein again.

Figure 12:
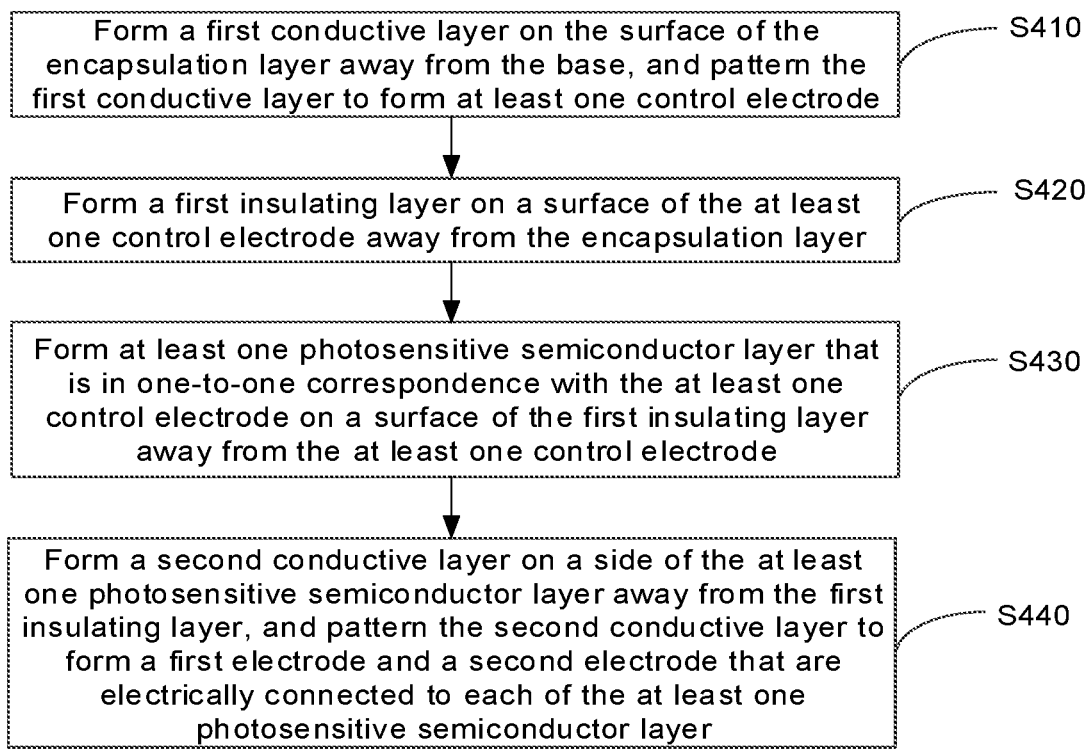
FIG. 12 is a flow chart of another method of manufacturing a display substrate, according to some embodiments of the present disclosure.

In some embodiments, the photosensitive sensor 3 is a photosensitive transistor. In S400, the step of forming the at least one photosensitive sensor 3 on the surface of the encapsulation layer 11 away from the base 10 includes S410 to S440 as shown in FIG. 12.

In S410, a first conductive layer is formed on the surface of the encapsulation layer 11 away from the base 10, and the first conductive layer is patterned to form at least one control electrode 31.

Herein, each control electrode 31 corresponds to a single photosensitive sensor 3.

In S420, a first insulating layer 32 is formed on a surface of at least one control electrode 31 away from the encapsulation layer 11.

In S430, at least one photosensitive semiconductor layer 33 that is in one-to-one correspondence with the at least one control electrode 31 is formed on a surface of the first insulating layer 32 away from the at least one control electrode 31.

The photosensitive semiconductor layer 33 is an effective component of the corresponding photosensitive sensor 3 for fingerprint collection. The photosensitive semiconductor layer 33 is usually formed by an evaporation process.

In S440, a second conductive layer is formed on a side of the at least one photosensitive semiconductor layer 33 away from the first insulating layer 32, and the second conductive layer is patterned to form a first electrode and a second electrode that are electrically connected to each of the at least one photosensitive semiconductor layer.

The first conductive layer and the second conductive layer are made of conductive materials (such as metal materials). Patterning the first conductive layer and the second conductive layer usually means etching them with masks to form desired patterns.

In the present disclosure, a photosensitive transistor, which has a simple structure and is easy to manufacture, is used as the photosensitive sensor 3.

In some embodiments, in S440, the step of forming the second conductive layer on the side of the at least one photosensitive semiconductor layer 33 away from the first insulating layer 32 and patterning the second conductive layer, further includes: forming at least one scanning signal line S1, and each of the at least one scanning signal line S1 being electrically connected to at least one first electrode 34; and forming at least one common electrode line S2, and each of the at least one common electrode line S2 being electrically connected to at least one second electrode 35.

Each scanning signal line S1, each common electrode line S2, and the first electrode 34 and second electrode 35 in each corresponding photosensitive sensor 3 are all formed by patterning the second conductive layer. This method is not only conducive to simplifying the manufacturing process of the display substrate, but may also be able to simplify the structure of the wire arrangement of the display substrate.

In some embodiments, the method of manufacturing the display apparatus further includes: forming at least one touch structure 5 on a side of the encapsulation layer 11 away from the base 10. An orthographic projection of any one of the at least one touch structure 5 on the base 10 is nonoverlapping with an orthographic projection of each photosensitive sensor 3 on the base 10.

Herein, the touch structure 5 is formed after the photosensitive sensor 3 is formed, or is formed before the photosensitive sensor 3 is formed, or is formed in synchronization with the photosensitive sensor 3, which is not limited in some embodiments of the present disclosure.

For example, each photosensitive sensor 3 includes: a control electrode 31, a first insulating layer 32, and a photosensitive semiconductor layer 33 that are sequentially stacked on top of one another in a direction away from the base 10; and a first electrode 34 and a second electrode 35 electrically connected to the photosensitive semiconductor layer 33. Each touch structure 5 includes a third electrode 51 and a fourth electrode 52 that are insulated from each other. The third electrode 51 includes two third sub-electrodes 511 arranged in a same layer as the fourth electrode 52, and a bridging sub-electrode 512 electrically connected to the two third sub-electrodes 511. The bridging sub-electrode 512 and the fourth electrode 52 are arranged in different layers and are insulated from each other. The touch control structure 5 and the photosensitive sensor 3 are formed simultaneously. That is, manufacturing steps of the touch control structure 5 and the photosensitive sensor 3 partially overlap, and some electrodes of the two may be formed simultaneously.

Figure 9A:
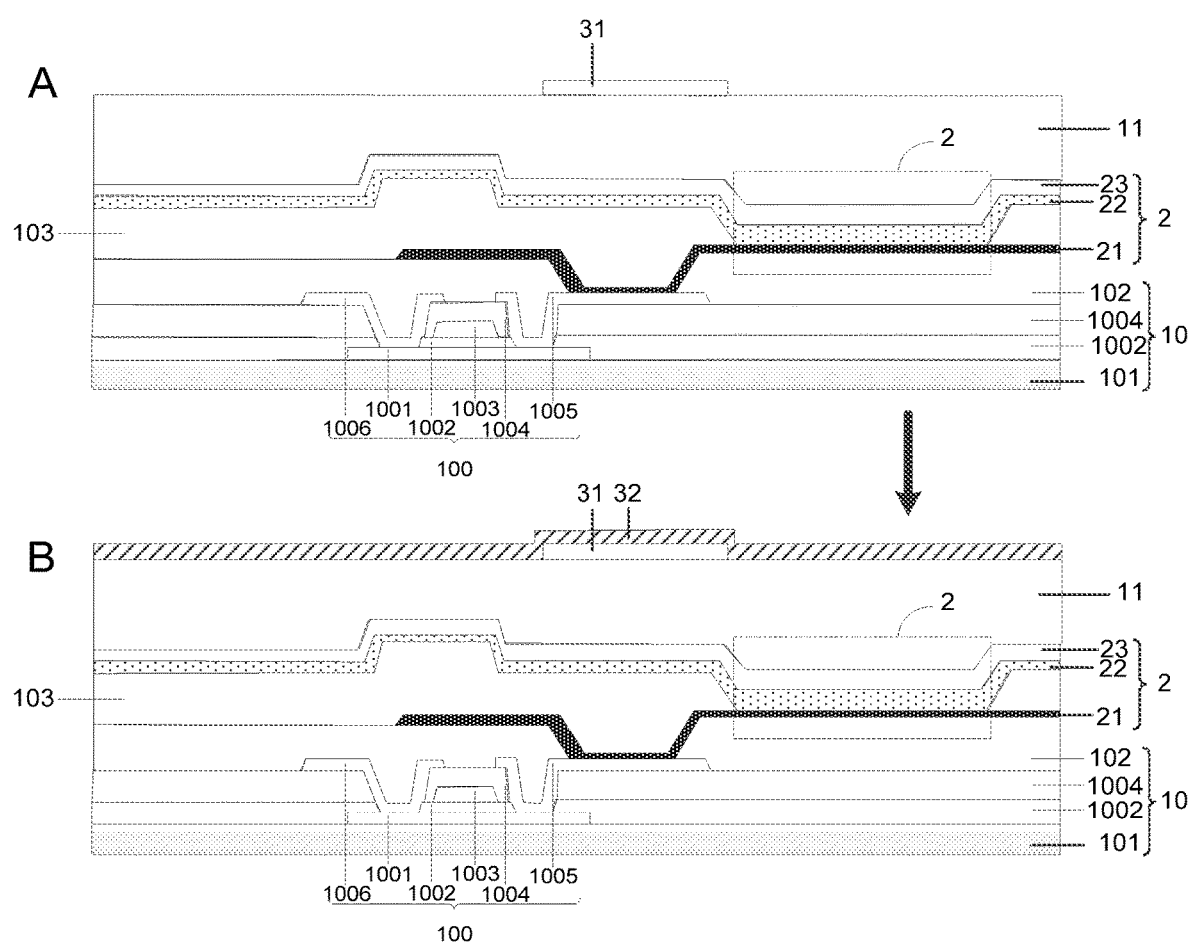
FIGS. 9A-9C are schematic diagrams of some steps in a method of manufacturing a display substrate, according to some embodiments of the present disclosure.
Figure 9B:
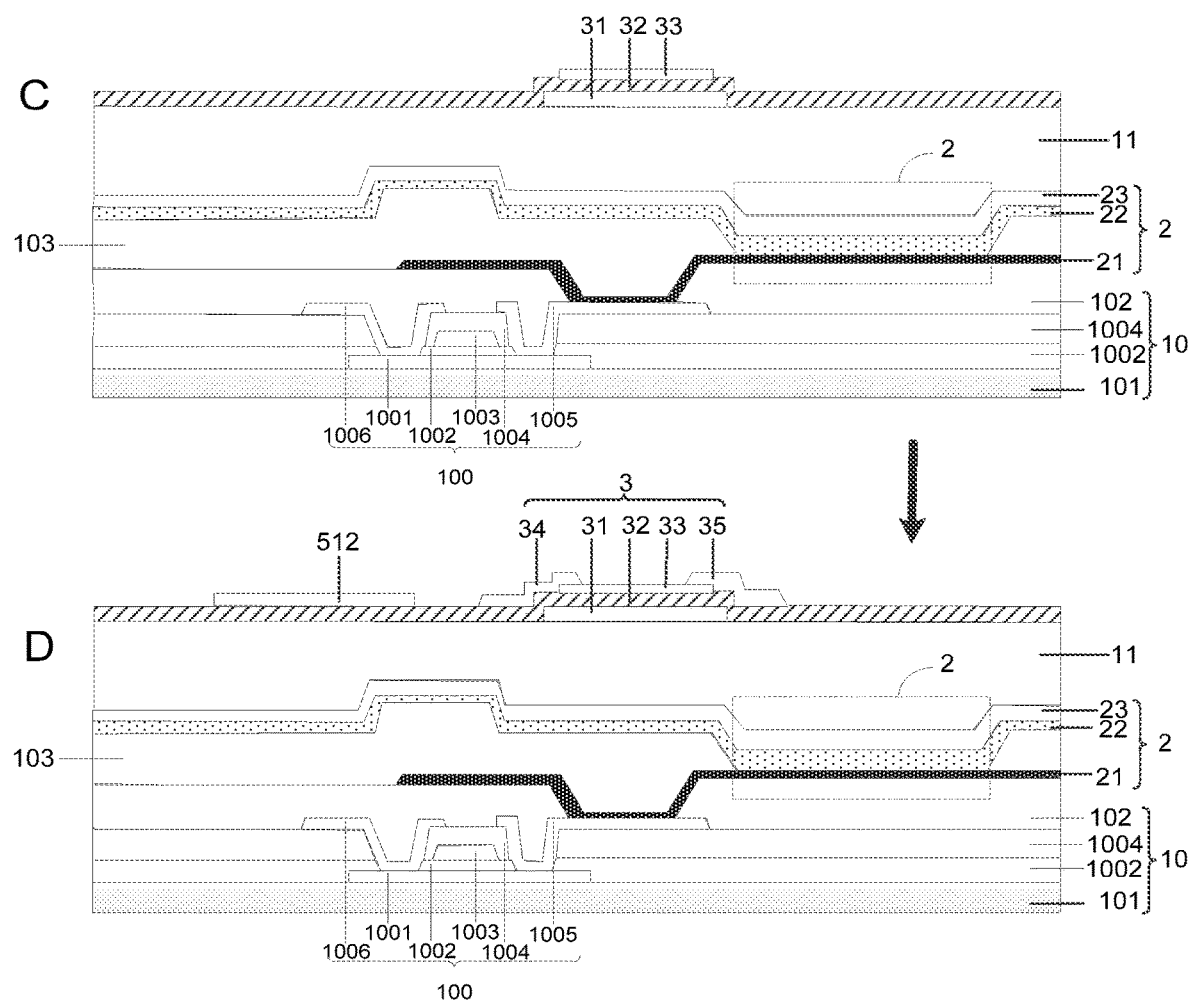
Figure 9C:
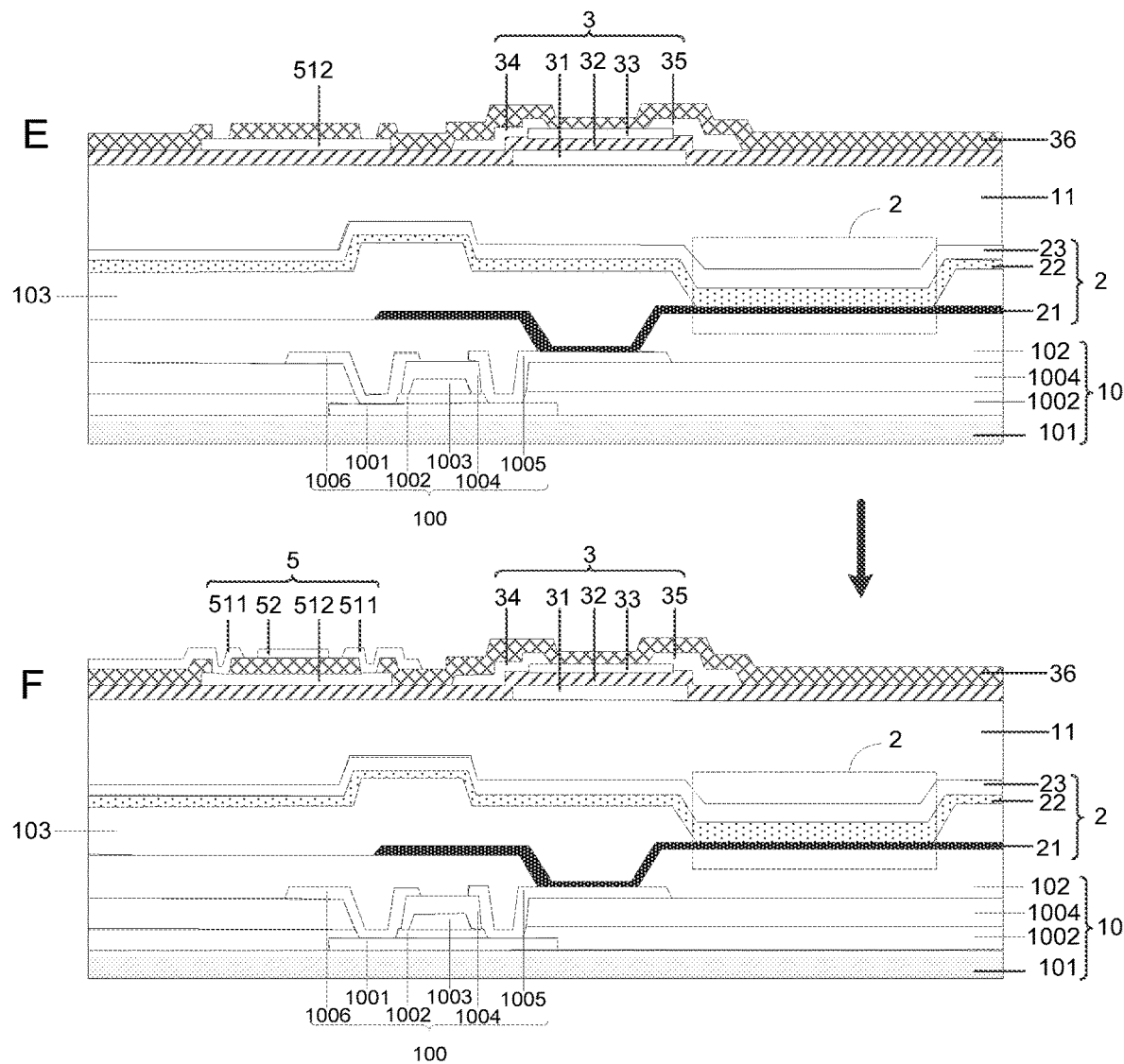
Figure 13:
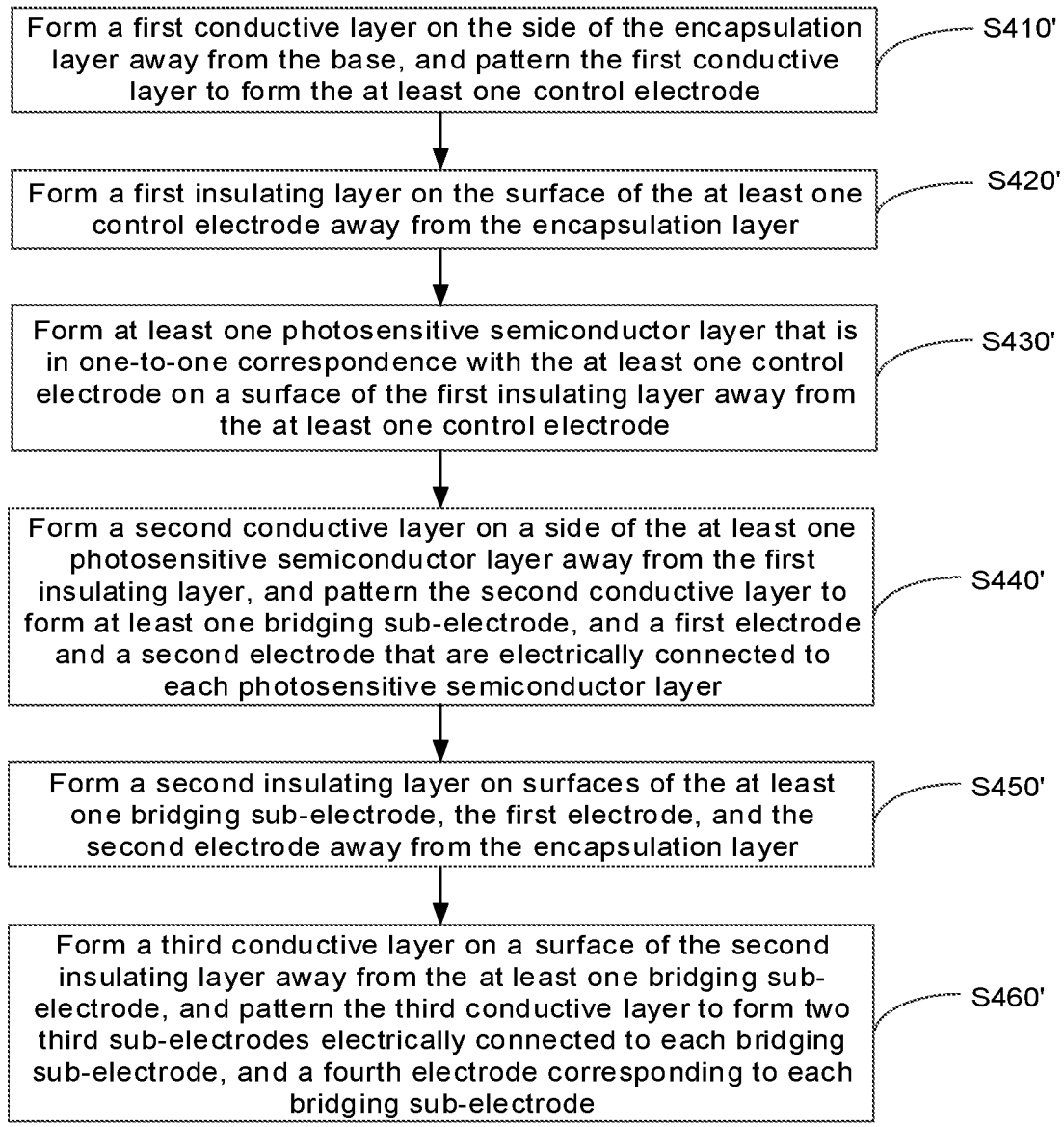
FIG. 13 is a flow chart of yet another method of manufacturing a display substrate, according to some embodiments of the present disclosure.

In some examples, the structure of the display substrate is as shown in FIG. 5. Referring to FIGS. 9A to 9C, the above step of forming at least one touch structure 5 on the side of the encapsulation layer 11 away from the base 10 further includes S410' to S460' as shown in FIG. 13.

In S410', as shown in part A of FIG. 9A, a first conductive layer is formed on the side of the encapsulation layer 11 away from the base 10, and the first conductive layer is patterned to form the at least one control electrode 31.

Herein, each control electrode 31 corresponds to a single photosensitive sensor 3.

In S420', as shown in part B of FIG. 9A, a first insulating layer 32 is formed on the surface of the at least one control electrode 31 away from the encapsulation layer 11.

In S430', as shown in part C of FIG. 9B, at least one photosensitive semiconductor layer 33 that is in one-to-one correspondence with the at least one control electrode 31 is formed on the surface of the first insulating layer 32 away from the at least one control electrode 31.

In S440', as shown in part D of FIG. 9B, a second conductive layer is formed on the side of the at least one photosensitive semiconductor layer 33 away from the first insulating layer 32, and the second conductive layer is patterned to form at least one bridging sub-electrode 512, and a first electrode 34 and a second electrode 35 that are electrically connected to each photosensitive semiconductor layer 33.

Herein, each bridging sub-electrode 512 corresponds to a single touch structure 5.

In S450', as shown in part E of FIG. 9C, a second insulating layer 36 is formed on surfaces of the at least one bridging sub-electrode 512, the first electrode 34, and the second electrode 35 away from the encapsulation layer 11.

In S460', as shown in part F of FIG. 9C, a third conductive layer is formed on a surface of the second insulating layer 36 away from the at least one bridging sub-electrode 512, and the third conductive layer is patterned to form two third sub-electrodes 511 electrically connected to each bridging sub-electrode 512, and a fourth electrode 52 corresponding to each bridging sub-electrode 512.

The first conductive layer, the second conductive layer, and the third conductive layer are made of conductive materials (such as metal materials), and patterning the first conductive layer, the second conductive layer, and the third conductive layer usually means etching them with masks to form desired patterns.

In some embodiments of the present disclosure, by using the second conductive layer to form the first electrode 34 and the second electrode 35 in the photosensitive sensor 3, and the bridging sub-electrode 512 in the touch control structure 5 simultaneously, it may be possible to simplify the manufacturing process of the display substrate and facilitate a design of the wire arrangement to reduce the difficulty of the design. In addition, in this way, it may also be possible to reduce the number of electrode layers required to be formed in the display substrate, which is conducive for realizing ultra-thin display substrates.

Figure 10A:
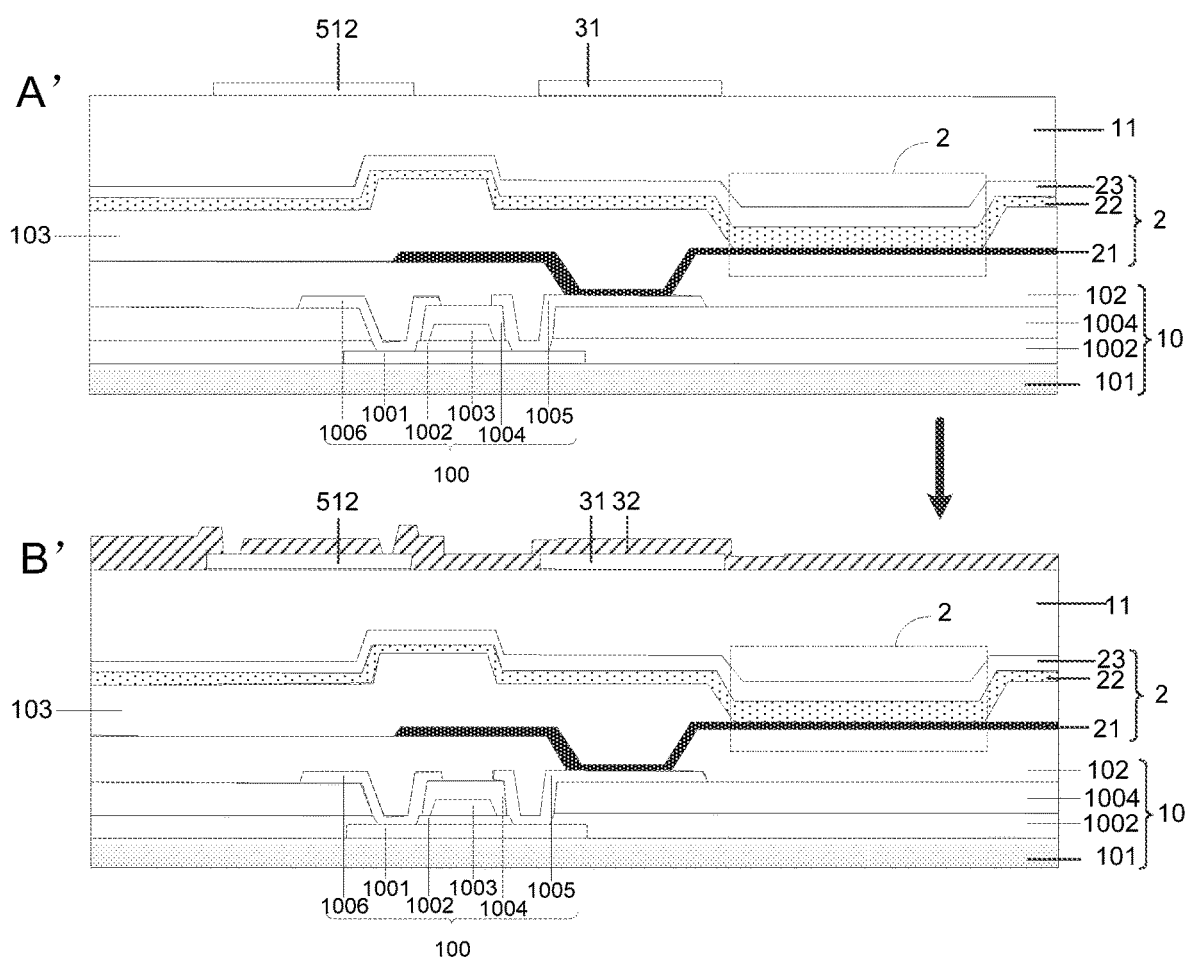
FIGS. 10A-10C are schematic diagrams of some steps in another method of manufacturing a display substrate, according to some embodiments of the present disclosure.
Figure 10B:
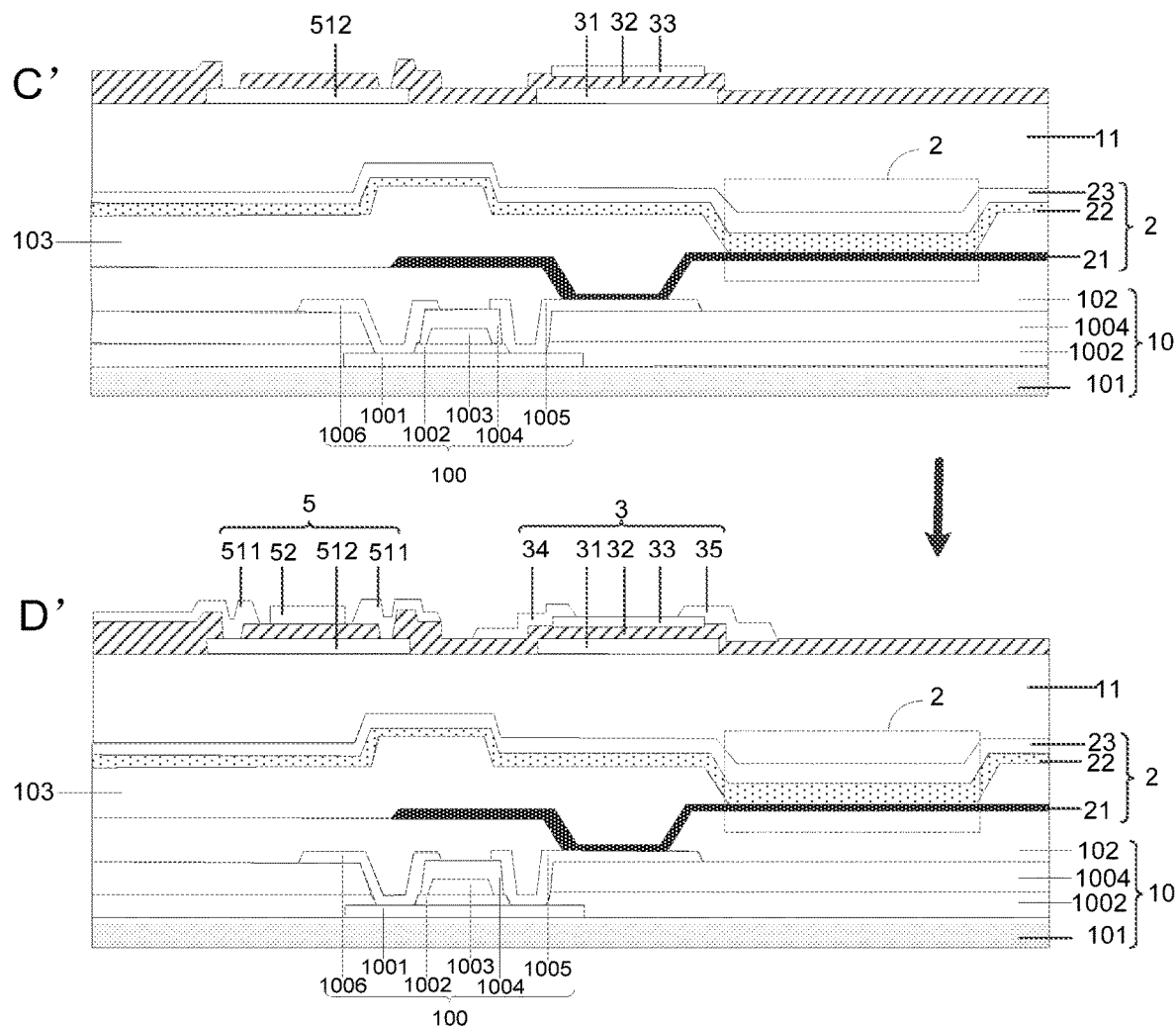
Figure 10C:
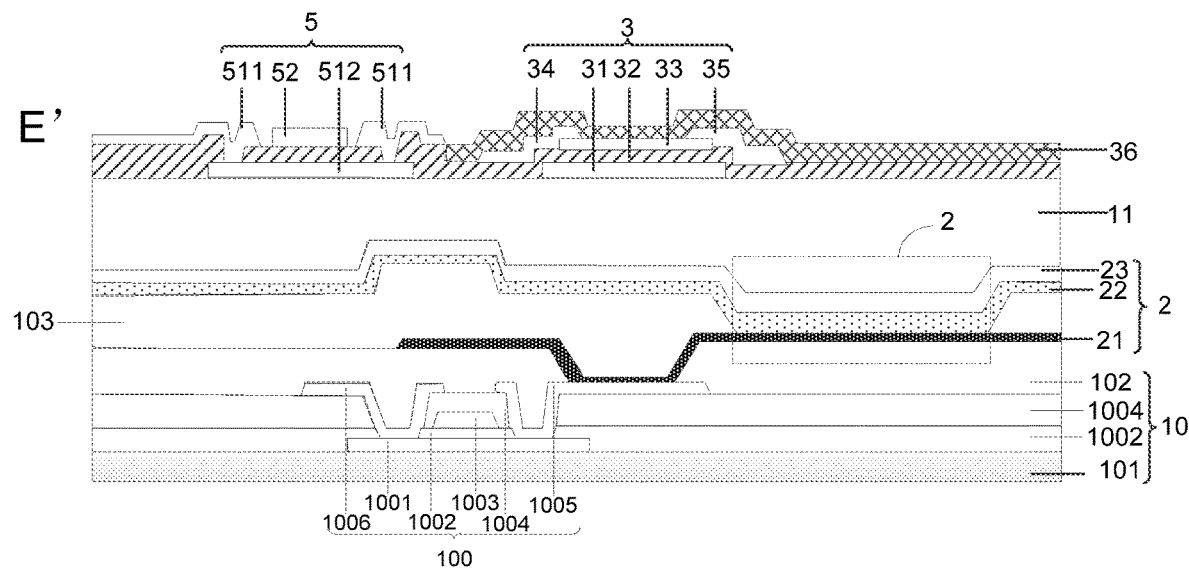
Figure 14:
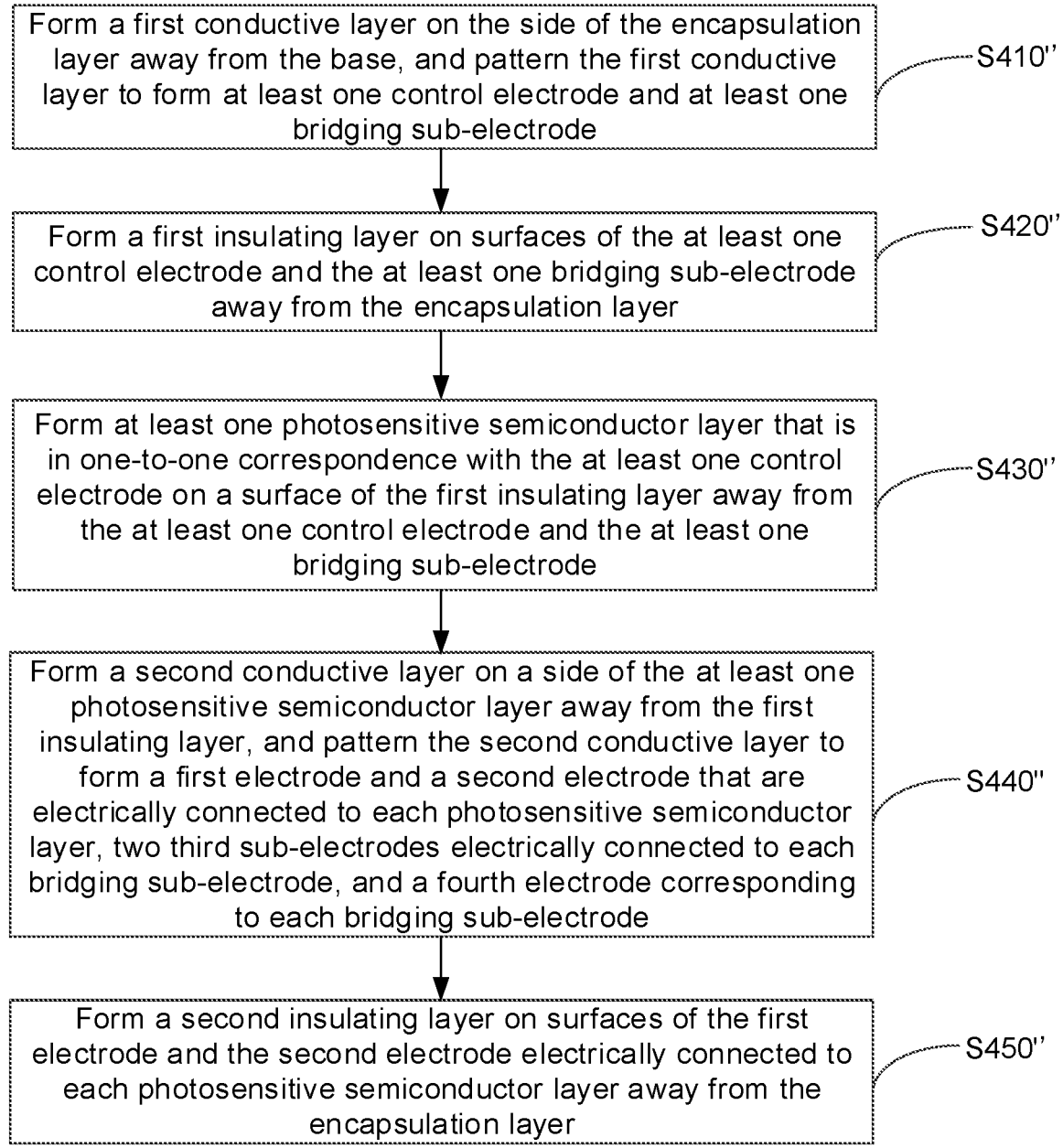
FIG. 14 is a flow chart of yet another method of manufacturing a display substrate, according to some embodiments of the present disclosure.

In other examples, the structure of the display substrate is as shown in FIG. 6. Referring to FIGS. 10A to 10C, the above step of forming the at least one touch structure 5 on the side of the encapsulation layer 11 away from the base 10 further includes S410" to S450" as shown in FIG. 14.

In S410", as shown in part A' of FIG. 10A, a first conductive layer is formed on the side of the encapsulation layer 11 away from the base 10, and the first conductive layer is patterned to form at least one control electrode 31 and at least one bridging sub-electrode 512.

Herein, each control electrode 31 corresponds to a single photosensitive sensor 3, and each bridging sub-electrode 512 corresponds to a single touch structure 5.

In S420", as shown in part B' of FIG. 10A, a first insulating layer 32 is formed on surfaces of the at least one control electrode 31 and the at least one bridging sub-electrode 512 away from the encapsulation layer 11.

In S430", as shown in part C' of FIG. 10B, at least one photosensitive semiconductor layer 33 that is in one-to-one correspondence with the at least one control electrode 31 is formed on a surface of the first insulating layer 32 away from the at least one control electrode 31 and the at least one bridging sub-electrode 512.

In S440", as shown in part D' of FIG. 10B, a second conductive layer is formed on a side of the at least one photosensitive semiconductor layer 33 away from the first insulating layer 32, and the second conductive layer is patterned to form a first electrode 34 and a second electrode 35 that are electrically connected to each photosensitive semiconductor layer 33, two third sub-electrodes 511 electrically connected to each bridging sub-electrode 512, and a fourth electrode 52 corresponding to each bridging sub-electrode 512.

The first conductive layer and the second conductive layer are made of conductive materials (such as metal materials), and patterning the first conductive layer and the second conductive layer usually means etching them with masks to form desired patterns.

In S450", as shown in part E' of FIG. 10C, a second insulating layer 36 is formed on surfaces of the first electrode 34 and the second electrode 35 electrically connected to each photosensitive semiconductor layer 33 away from the encapsulation layer 11.

In some embodiments of the present disclosure, by using the first conductive layer to form the control electrode 31 in the photosensitive sensor 3 and the bridging sub-electrode 512 in the touch control structure 5 simultaneously, and by using the second conductive layer to form the first electrode 34 and the second electrode 35 in the photosensitive sensor 3, and the third sub-electrodes 511 and the fourth electrode 52 in the touch control structure 5, it may be possible to reduce the number of electrode layers required to be formed in the display substrate, reduce the number corresponding patterning processes, and thus simplify the manufacturing process of the display substrate. It is also conducive to realizing ultra-thin display substrates.

In some examples, the structure of the display substrate is as shown in FIGS. 4-7. The method of manufacturing the display substrate further includes: forming at least one light-shielding portion 41 at the side of the at least one photosensitive sensor 3 away from the base 10. An orthographic projection of each photosensitive sensor 3 on the base 10 is nonoverlapping with or partially overlaps an orthographic projection of any one of the at least one light-shielding portion 41 on the base 10. In this way, it may be possible to prevent the light-shielding portions 41 from blocking the fingerprint recognition optical signals to be collected by the photosensitive sensor 3, and thereby ensure that the photosensitive sensor 3 may effectively collect the fingerprint recognition optical signals.

Herein, the first planarization layer 12 is generally disposed between the light-shielding portion 41 and the photosensitive sensor 3, and the light-shielding portion 41 is formed on a surface of the first planarization layer 12 away from the photosensitive sensor 3. That is to say, the light-shielding portions 41 are formed after the photosensitive sensor 3 and the first planarization layer 12 are formed.

In some examples, the touch structure 5 is located on the side of the first planarization layer 12 proximate to the photosensitive sensor 3. That is, after the photosensitive sensor 3 and the touch structure 5 are formed, the first planarization layer 12 is first formed, so as to use the first planarization layer 12 to planarize the surfaces of the photosensitive sensors 3 and the touch control structures 5; then, the light-shielding portions 41 are formed.

In some examples, the structure of the display substrate is as shown in FIGS. 4-7. The method of manufacturing the display substrate further includes: forming a plurality of color filter portions 42 at the side of the at least one photosensitive sensor 3 away from the base 10. An orthographic projection of each of the plurality of light-emitting devices 2 on the base 10 is within a range of an orthographic projection of one of the plurality of color filter portions 42 on the base 10. An orthographic projection of each of the at least one photosensitive sensor 3 on the base 10 is within the range of the orthographic projection of one of the plurality of color filter portions 42 on the base 10, or partially overlaps with the orthographic projection of one of the plurality of color filter portions 42 on the base 10. In this way, it may be possible to prevent the photosensitive sensor 3 from being blocked by the light-shielding portions 41, and ensure that the fingerprint recognition optical signals may be effectively collected by the corresponding photosensitive sensor 3 after passing through the color filter portions 42.

Herein, the color filter portions 42 are formed after the light-shielding portions 41 are formed. In the case where the light-shielding portions 41 are a black matrix made of black resin, the light-shielding portions 41 and the color filter portions 42 may be formed by a same manufacturing process. Since the light-shielding portions 41 are usually formed on the surface of the first planarization layer 12 away from the photosensitive sensor 3, in some embodiments, the method of manufacturing the display substrate further includes: forming a first planarization layer 12 between the plurality of color filter portions 42 and at least one photosensitive sensor 3. That is, the color filter portions 42 are formed on a flat surface of the first planarization layer 12 away from the photosensitive sensor 3. In this way, it may be possible to ensure that the light emitted from each light-emitting device 2 enters the corresponding color filter portion 42 from the same plane, and thereby ensure the uniform display of the display substrate.

In addition, since the first planarization layer 12 is formed before the light-shielding portions 41 and the color filter portions 42 are formed, the first planarization layer 12 may be able to protect the photosensitive sensors 3 and the touch structures 5 in the manufacturing process of the light-shielding portions 41 and the color filter portions 42, and thereby prevent the manufacturing process from affecting the reliability of the photosensitive sensors 3 and the touch structures 5.

In some examples, the structure of the display substrate is as shown in FIG. 7. The method of manufacturing the display substrate further includes: providing a second planarization layer 13 on a side of the plurality of color filter portions 42 away from the base 10. In a case where the display substrate further includes at least one light-shielding portion 41, the at least one light-shielding portion 41 is located on a side of the second planarization layer 13 proximate to the plurality of color filter portions 42.

Herein, the second planarization layer 13 is formed after the light-shielding portions 41 and the color filter portions 42 are formed, so that the second planarization layer 13 may be able to planarize the surfaces of the light-shielding portions 41 and the color filter portions 42, and thus ensure that the display substrate has a flat display surface. For example, the second planarization layer 13 is made of glass, and the second planarization layer 13 can be equivalent to a display cover plate.

Figure 11:
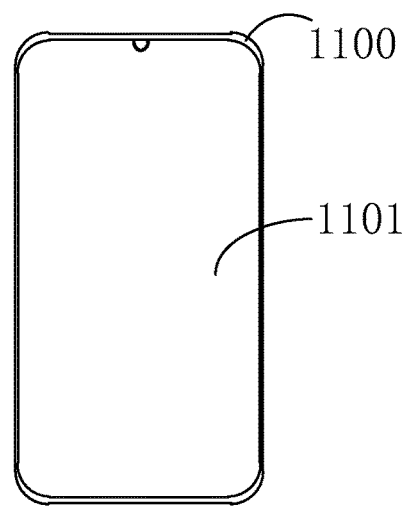
FIG. 11 is a schematic diagram of a display device, according to some embodiments of the present disclosure.

Some embodiments of the present disclosure further provide a display device 1100. As shown in FIG. 11, the display device 1100 includes the display substrate 1101 described in the above embodiments. The display device has the same beneficial effects as the display substrate described above, and details are not described herein again.

In some embodiments, the display device includes any product or component having a display function, such as an electronic paper, a mobile phone, a tablet computer, a television, a display, a notebook computer, or a navigator.

n the description of the above embodiments, specific features, structures, materials or characteristics may be combined in any suitable manner in any one or more embodiments or examples.

The forgoing descriptions are merely specific implementation manners of the present disclosure, but the protection scope of the present disclosure is not limited thereto. A person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate, comprising:
  a base;
  a plurality of light-emitting devices disposed on the base;
  an encapsulation layer disposed on a light-emitting side of the plurality of light-emitting devices away from the base;
  at least one photosensitive sensor disposed on a surface of the encapsulation layer away from the base, wherein each of the at least one photosensitive sensor is configured to collect optical signals for texture recognition; and
  at least one touch structure disposed at a side of the encapsulation layer away from the base, wherein an orthographic projection of any one of the at least one touch structure on the base is nonoverlapping with an orthographic projection of each photosensitive sensor on the base,
  wherein the photosensitive sensor includes a control electrode, a first insulating layer, a photosensitive semiconductor layer, a first electrode and a second electrode; the control electrode, the first insulating layer and the photosensitive semiconductor layer are sequentially stacked on top of one another in a direction away from the base; and the first electrode and the second electrode are electrically connected to the photosensitive semiconductor layer, wherein the first electrode in the at least one photosensitive sensor is further electrically connected to a scanning signal line, and wherein the second electrode in the at least one photosensitive sensor is further electrically connected to a common electrode line.

2. The display substrate according to claim 1, wherein each of the at least one touch structure includes a third electrode and a fourth electrode that are insulated from each other; the third electrode includes two third sub-electrodes arranged in a same layer as the fourth electrode, and a bridging sub-electrode electrically connected to the two third sub-electrodes; and the bridging sub-electrode and the fourth electrode are arranged in different layers and are insulated from each other, and wherein the first electrode and the second electrode in the photosensitive sensor are arranged in a same layer as the bridging sub-electrode and are insulated from the bridging sub-electrode.

3. The display substrate according to claim 1, wherein each of the at least one touch structure includes a third electrode and a fourth electrode that are insulated from each other; the third electrode includes two third sub-electrodes arranged in a same layer as the fourth electrode, and a bridging sub-electrode electrically connected to the two third sub-electrodes; the bridging sub-electrode and the fourth electrode are arranged in different layers and are insulated from each other, and wherein the control electrode in the photosensitive sensor and the bridging sub-electrode are arranged in a same layer and are insulated from each other, and the first electrode and the second electrode in the photosensitive sensor are arranged in a same layer as the fourth electrode and are insulated from the fourth electrode.

4. The display substrate according to claim 1, further comprising: at least one light-shielding portion disposed at a side of the at least one photosensitive sensor away from the base, wherein the orthographic projection of each photosensitive sensor on the base is nonoverlapping with or partially overlaps with an orthographic projection of any one of the at least one light-shielding portion on the base.

5. The display substrate according to claim 4, wherein an orthographic projection of the photosensitive semiconductor layer in each photosensitive sensor on the base is outside a range of the orthographic projection of any one of the at least one light-shielding portion on the base.

6. The display substrate according to claim 4, further comprising: a plurality of color filter portions disposed at the side of the at least one photosensitive sensor away from the base, wherein an orthographic projection of each of the plurality of light-emitting devices on the base is within a range of an orthographic projection of one of the plurality of color filter portions on the base;

an orthographic projection of each of the at least one photosensitive sensor on the base is located within the range of the orthographic projection of one of the plurality of color filter portions on the base, or partially overlaps with the orthographic projection of one of the plurality of color filter portions on the base.

7. The display substrate according to claim 6, wherein the at least one light-shielding portion includes a plurality of light-shielding portions arranged in an array;

one color filter portion is disposed between any two adjacent light-shielding portions along a row direction or a column direction, and an orthographic projection of a region between any two adjacent light-shielding portions on the base is within a range of an orthographic projection of the color filter portion on the base.

8. The display substrate according to claim 6, further comprising: a first planarization layer disposed between the plurality of color filter portions and the at least one photosensitive sensor, wherein the at least one touch structure is located on a side of the first planarization layer proximate to the at least one photosensitive sensor, or the display substrate further comprises a first planarization layer disposed between the plurality of color filter portions and the at least one photosensitive sensor, wherein the at least one touch structure is located on a side of the first planarization layer proximate to the at least one photosensitive sensor, and the at least one light-shielding portion is located on a side of the first planarization layer proximate to the plurality of color filter portions.

9. The display substrate according to claim 6, further comprising: a second planarization layer disposed on a side of the plurality of color filter portions away from the base, wherein the at least one light-shielding portion is located on a side of the second planarization layer proximate to the plurality of color filter portions.

10. A display device, comprising the display substrate according to claim 1.

11. A method of manufacturing a display substrate, comprising:

providing a base;

forming a plurality of light-emitting devices on the base;

forming an encapsulation layer on a side of the plurality of light-emitting devices away from the base;

forming at least one photosensitive sensor on a surface of the encapsulation layer away from the base, wherein each of the at least one photosensitive sensor is configured to collect optical signals for texture recognition; and forming at least one touch structure at a side of the encapsulation layer away from the base, wherein an orthographic projection of any one of the at least one touch structure on the base is nonoverlapping with an orthographic projection of each photosensitive sensor on the base, and wherein forming the at least one photosensitive sensor on the surface of the encapsulation layer away from the base includes:

forming a first conductive layer on the surface of the encapsulation layer away from the base and patterning the first conductive layer to form at least one control electrode;

forming a first insulating layer on a surface of the at least one control electrode away from the encapsulation layer;

forming at least one photosensitive semiconductor layer that is in one-to-one correspondence with the at least one control electrode on a surface of the first insulating layer away from the at least one control electrode; and forming a second conductive layer on a side of the at least one photosensitive semiconductor layer away from the first insulating layer and patterning the second conductive layer to form a first electrode and a second electrode that are electrically connected to each of the at least one photosensitive semiconductor layer;

forming the second conductive layer on the side of the at least one photosensitive semiconductor layer away from the first insulating layer and patterning the second conductive layer further includes:

forming at least one scanning signal line, each of the at least one scanning signal line being electrically connected to at least one first electrode; and forming at least one common electrode line, each of the at least one common electrode line being electrically connected to at least one second electrode.

12. The method of manufacturing the display substrate according to claim 11, wherein each of the at least one touch structure includes a third electrode and a fourth electrode that are insulated from each other; the third electrode includes two third sub-electrodes arranged in a same layer as the fourth electrode, and a bridging sub-electrode electrically connected to the two third sub-electrodes; and the bridging sub-electrode and the fourth electrode are arranged in different layers and are insulated from each other;

forming the at least one touch structure on the side of the encapsulation layer away from the base, further includes:

forming the first conductive layer on the side of the encapsulation layer away from the base and patterning the first conductive layer to form the at least one control electrode and the bridging sub-electrode; forming the second conductive layer on the side of the at least one photosensitive semiconductor layer away from the first insulating layer and patterning the second conductive layer to form the first electrode and the second electrode that are electrically connected to each photosensitive semiconductor layer, the two third sub-electrodes electrically connected to the bridging sub-electrode, and the fourth electrode corresponding to the bridging sub-electrode.

13. The method of manufacturing the display substrate according to claim 11, wherein each of the at least one touch structure includes a third electrode and a fourth electrode that are insulated from each other; the third electrode includes two third sub-electrodes arranged in a same layer as the fourth electrode, and a bridging sub-electrode electrically connected to the two third sub-electrodes; and the bridging sub-electrode and the fourth electrode are arranged in different layers and are insulated from each other;

forming the at least one touch structure on the side of the encapsulation layer away from the base, further includes: forming the second conductive layer on a side of the at least one photosensitive semiconductor layer away from the first insulating layer and patterning the second conductive layer to form the bridging sub-electrode, and the first electrode and the second electrode that are electrically connected to each photosensitive semiconductor layer; and forming a third conductive layer on a side of the bridging sub-electrode away from the first insulating layer and patterning the third conductive layer to form the two third sub-electrodes electrically connected to the bridging sub-electrode, and the fourth electrode corresponding to the bridging sub-electrode.

14. The method of manufacturing the display substrate according to claim 11, further comprising: forming at least one light-shielding portion at a side of the at least one photosensitive sensor away from the base, wherein an orthographic projection of each photosensitive sensor on the base is nonoverlapping with or partially overlaps with an orthographic projection of any one of the at least one light-shielding portion on the base, and the method further comprises: forming a plurality of color filter portions at the side of the at least one photosensitive sensor away from the base, wherein an orthographic projection of each of the plurality of light-emitting devices on the base is within a range of an orthographic projection of one of the plurality of color filter portions on the base; and an orthographic projection of each of the at least one photosensitive sensor on the base is within the range of the orthographic projection of one of the plurality of color filter portions on the base, or partially overlaps with the orthographic projection of one of the plurality of color filter portions on the base.

\* \* \* \* \*